US012610616B2

(12) United States Patent
Miyamoto

(10) Patent No.: US 12,610,616 B2
(45) Date of Patent: Apr. 21, 2026

(54) DISPLAY DEVICE AND METHOD FOR MANUFACTURING SAME

(71) Applicant: SHARP KABUSHIKI KAISHA, Sakai City (JP)

(72) Inventor: Tadayoshi Miyamoto, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 426 days.

(21) Appl. No.: 18/265,941

(22) PCT Filed: Dec. 8, 2020

(86) PCT No.: PCT/JP2020/045620
§ 371 (c)(1),
(2) Date: Jun. 7, 2023

(87) PCT Pub. No.: WO2022/123647
PCT Pub. Date: Jun. 16, 2022

(65) Prior Publication Data
US 2024/0040836 A1 Feb. 1, 2024

(51) Int. Cl.
| | |
|---|---|
| *H10D 86/40* | (2025.01) |
| *H10K 59/12* | (2023.01) |
| *H10K 59/121* | (2023.01) |
| *H10K 59/131* | (2023.01) |
| *H10K 59/80* | (2023.01) |
| *H10K 71/60* | (2023.01) |

(52) U.S. Cl.
CPC ....... *H10D 86/423* (2025.01); *H10K 59/1201* (2023.02); *H10K 59/1213* (2023.02); *H10K 59/131* (2023.02); *H10K 59/871* (2023.02);

*H10K 59/8792* (2023.02); *H10K 71/60* (2023.02); *H10K 59/873* (2023.02)

(58) Field of Classification Search
CPC .. H10D 86/423; H10D 86/60; H10K 59/1201; H10K 59/1213; H10K 59/131; H10K 59/871; H10K 59/8792; H10K 71/60; H10K 59/873; H10K 59/126
See application file for complete search history.

(56) References Cited

U.S. PATENT DOCUMENTS

| | | | | |
|---|---|---|---|---|
| 12,068,333 B2 * | 8/2024 | Gao | | H10K 59/1213 |
| 2011/0049523 A1 * | 3/2011 | Choi | | H10D 86/471 |
| | | | | 438/34 |
| 2012/0161125 A1 | 6/2012 | Yamazaki | | |
| 2016/0380107 A1 | 12/2016 | Yamazaki | | |

(Continued)

FOREIGN PATENT DOCUMENTS

| | | |
|---|---|---|
| JP | 2011-048339 A | 3/2011 |
| JP | 2012-151460 A | 8/2012 |
| JP | 2020-017558 A | 1/2020 |

*Primary Examiner* — J. E. Schoenholtz
(74) *Attorney, Agent, or Firm* — ScienBiziP, P.C.

(57) ABSTRACT

A first TFT includes a first semiconductor layer formed of polysilicon, a gate insulating film provided on the first semiconductor layer, a third semiconductor layer provided on the gate insulating film, and a first gate electrode provided on the third semiconductor layer, and a second TFT includes a second semiconductor layer formed of an oxide semiconductor, a first metal layer and a second metal layer formed on a third conductor region and a fourth conductor region, respectively, of the second semiconductor layer.

20 Claims, 20 Drawing Sheets

(56)     References Cited

U.S. PATENT DOCUMENTS

| | | |
|---|---|---|
| 2020/0381558 A1 | 12/2020 | Yamazaki |
| 2021/0036029 A1* | 2/2021 | Park ..................... H10D 86/431 |
| 2022/0384443 A1 | 12/2022 | Yamazaki |

* cited by examiner

50(D)

12a

11

10

DISPLAY DEVICE AND METHOD FOR MANUFACTURING SAME

TECHNICAL FIELD

The disclosure relates to a display device and a method for manufacturing the same.

BACKGROUND ART

In recent years, self-luminous organic electroluminescence (hereinafter also referred to as EL) display devices using organic EL elements have attracted attention as display devices that can replace liquid crystal display devices. In the organic EL display device, a plurality of thin film transistors (hereinafter also referred to as "TFTs") are provided for each subpixel being the smallest unit of an image. Here, well known examples of a semiconductor layer constituting the TFT are a semiconductor layer made of polysilicon having high mobility, a semiconductor layer made of an oxide semiconductor such as In—Ga—Zn—O having a low leakage current, and the like.

For example, PTL 1 discloses a display device having a hybrid structure in which a first TFT using a polysilicon semiconductor and a second TFT using an oxide semiconductor are formed on a substrate.

CITATION LIST

Patent Literature

PTL 1: JP2020-17558 A (FIG. 5 and FIG. 6)

SUMMARY

Technical Problem

In a TFT using a polysilicon semiconductor, in a case where a contact hole for electrically connecting a source electrode and a drain electrode to a semiconductor layer made of polysilicon is formed in an inorganic insulating film, the contact hole reaching the semiconductor layer is required to be reliably formed by, for example, patterning the inorganic insulating film by dry etching, and then cleaning the inorganic insulating film with hydrofluoric acid. On the other hand, in a TFT using an oxide semiconductor, for example, in a case where the inorganic insulating film is patterned by dry etching, and then cleaned with hydrofluoric acid, the semiconductor layer made of the oxide semiconductor and exposed from the contact hole is easily dissolved. Thus, in a display device having a hybrid structure in which the TFT using the polysilicon semiconductor and the TFT using the oxide semiconductor are formed on the same substrate, it is difficult to form contact holes in the same process.

In the display device disclosed in PTL 1, the contact hole of the TFT using the oxide semiconductor reaches not the semiconductor layer made of the oxide semiconductor but a metal layer in contact with the semiconductor layer. Therefore, the semiconductor layer made of the oxide semiconductor is not dissolved even in a case where the cleaning is performed with hydrofluoric acid, but in a case where the semiconductor layer made of polysilicon is doped, the semiconductor layer made of the oxide semiconductor is also doped unless a mask which overlaps the entire semiconductor layer made of the oxide semiconductor is formed. Thus, there is room for improvement.

The disclosure has been made in view of the above, and an object of the disclosure is to reliably form a contact hole for electrically connecting to a semiconductor layer in an inorganic insulating film while suppressing a manufacturing cost.

Solution to Problem

In order to achieve the above object, a display device according to the disclosure includes a base substrate and a thin film transistor layer provided on the base substrate, and in the thin film transistor layer, a first thin film transistor includes a first semiconductor layer formed of polysilicon and a second thin film transistor including a second semiconductor layer formed of an oxide semiconductor are provided for each subpixel, the first thin film transistor includes the first semiconductor layer provided on a base coat film and including a first conductor region and a second conductor region defined to be separated from each other, a gate insulating film provided on the first semiconductor layer, a third semiconductor layer provided on the gate insulating film and formed of the same material and in the same layer as the second semiconductor layer, a first gate electrode provided on the third semiconductor layer and configured to control conduction between the first conductor region and the second conductor region, an interlayer insulating film provided to cover the first gate electrode, and a first terminal electrode and a second terminal electrode provided on the interlayer insulating film to be separated from each other, and electrically connected to the first conductor region and the second conductor region, respectively, and the second thin film transistor includes the gate insulating film, the second semiconductor layer provided on the gate insulating film and including a third conductor region and a fourth conductor region defined to be separated from each other, a first metal layer and a second metal layer provided on the third conductor region and the fourth conductor region, respectively, and formed of the same material and in the same layer as the first gate electrode, the interlayer insulating film provided on the first metal layer and the second metal layer, a third terminal electrode and a fourth terminal electrode provided on the interlayer insulating film to be separated from each other and electrically connected to the first metal layer and the second metal layer, respectively, and a second gate electrode configured to control conduction between the third conductor region and the fourth conductor region.

A method for manufacturing a display device according to the disclosure is a method for manufacturing a display device, the display device including a base substrate, and a thin film transistor layer provided on the base substrate, wherein in the thin film transistor layer, a first thin film transistor including a first semiconductor layer formed of polysilicon and a second thin film transistor including a second semiconductor layer formed of an oxide semiconductor are provided for each subpixel, the first thin film transistor includes the first semiconductor layer provided on a base coat film and including a first conductor region and a second conductor region separated from each other and a first channel region between the first conductor region and the second conductor region being defined, a gate insulating film provided on the first semiconductor layer, a third semiconductor layer provided on the gate insulating film and formed of the same material and in the same layer as the second semiconductor layer, a first gate electrode provided on the third semiconductor layer and configured to control conduction between the first conductor region and the second conductor region, an interlayer insulating film provided to cover the first gate electrode, and a first terminal electrode and a second terminal electrode provided on the interlayer insulating film to be separated from each other and electrically connected to the first conductor region and the second conductor region, respectively, and the second thin film transistor includes the second semiconductor layer provided on the gate insulating film and including a third conductor region and a fourth conductor region separated from each other and a second channel region between the third conductor region and the fourth conductor region being defined, a first metal layer and a second metal layer provided on the third conductor region and the fourth conductor region, respectively, and formed of the same material and in the same layer as the first gate electrode, the interlayer insulating film provided on the first metal layer and the second metal layer, a third terminal electrode and a fourth terminal electrode provided on the interlayer insulating film to be separated from each other and electrically connected to the first metal layer and the second metal layer, respectively, and a second gate electrode configured to control conduction between the third conductor region and the fourth conductor region, the method including: forming the base coat film on the base substrate; forming the first semiconductor layer on the base coat film; forming a layered film by sequentially film forming the gate insulating film, a second semiconductor film formed of the oxide semiconductor, and a metal film to cover the first semiconductor layer; forming a resist pattern on the layered film such that the resist pattern overlaps portions to be the first channel region and the second semiconductor layer and a portion to be the second channel region is relatively thin; patterning a layered film to form the first gate electrode, the third semiconductor layer, and the second semiconductor layer by removing the metal film exposed from the resist pattern and the second semiconductor film under the metal film; performing doping using the resist pattern as a mask to form the first conductor region, the first channel region, and the second conductor region; forming the first metal layer and the second metal layer by removing the metal film exposed by thinning the resist pattern by ashing; forming the interlayer insulating film after removing the resist pattern; forming contact holes reaching the first metal layer, the second metal layer, the first conductor region, and the second conductor region, in the interlayer insulating film; and forming the first terminal electrode, the second terminal electrode, the third terminal electrode, and the fourth terminal electrode on the interlayer insulating film.

Advantageous Effects of Disclosure

According to the disclosure, a contact hole for electrically connecting to a semiconductor layer can be reliably formed in an inorganic insulating film while suppressing a manufacturing cost.

DESCRIPTION OF EMBODIMENTS

Embodiments of a technique according to the disclosure will be described below in detail with reference to the drawings. Note that the technique according to the disclosure is not limited to the embodiments to be described below.

First Embodiment

Figure 1:
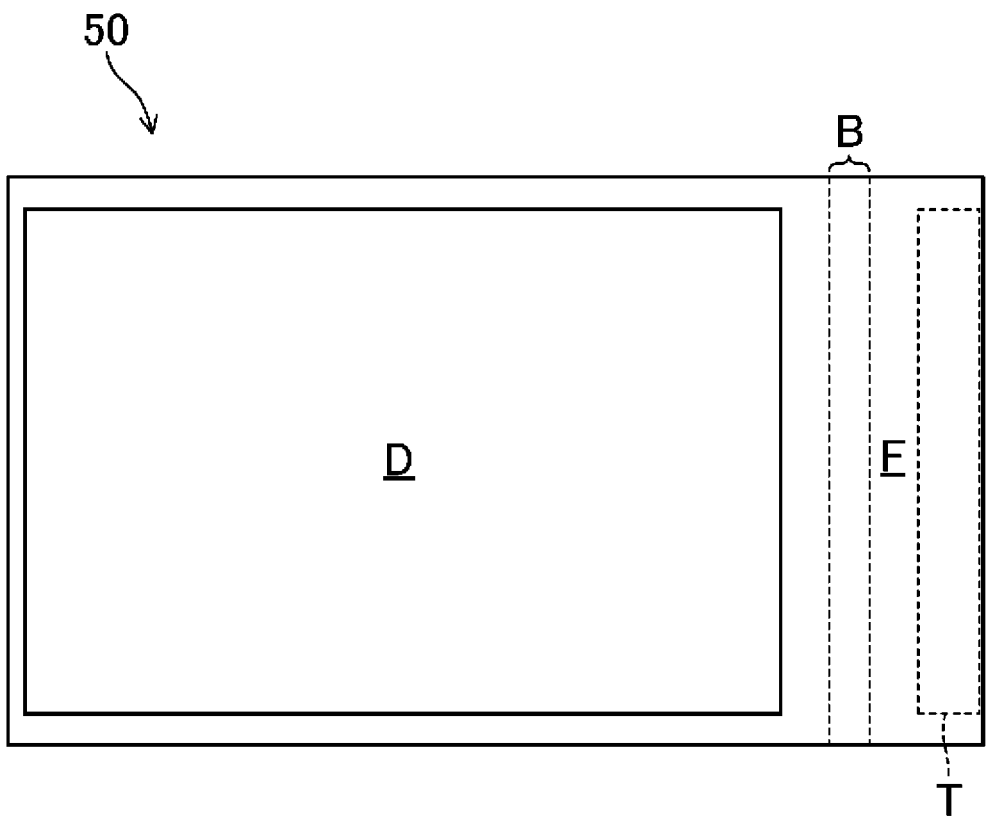
FIG. 1 is a plan view illustrating a schematic configuration of an organic EL display device according to a first embodiment of the disclosure.
Figure 2:
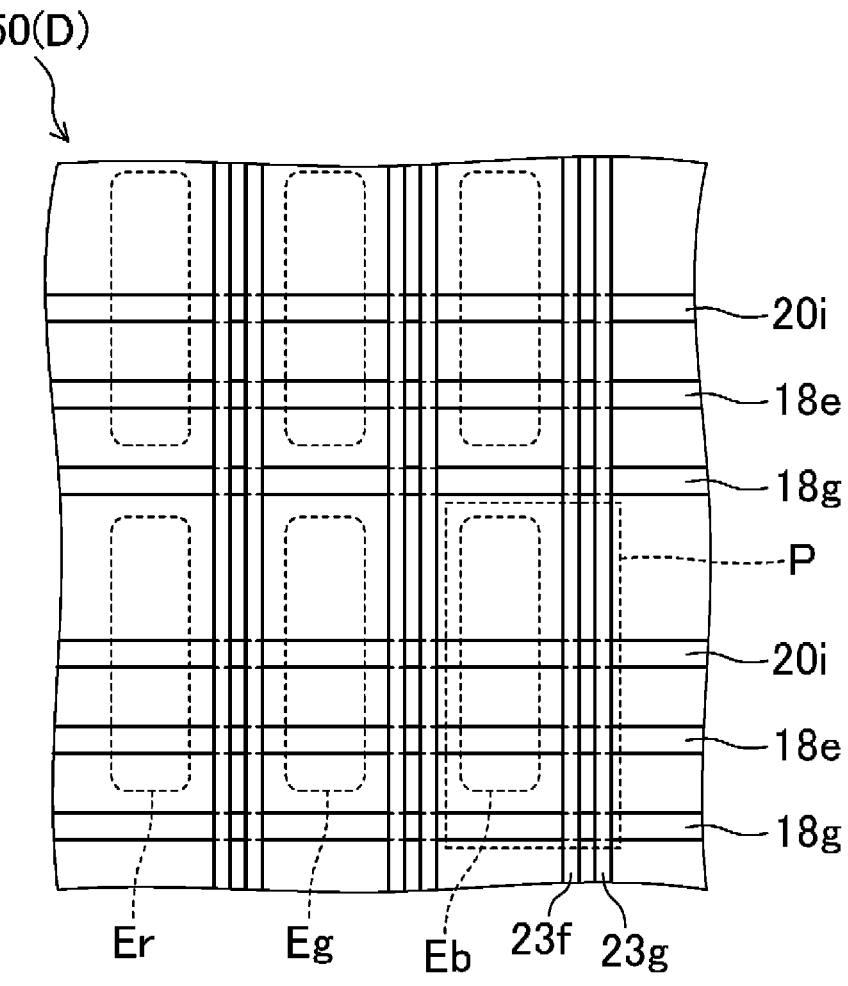
FIG. 2 is a plan view of a display region of the organic EL display device according to the first embodiment of the disclosure.
Figure 3:
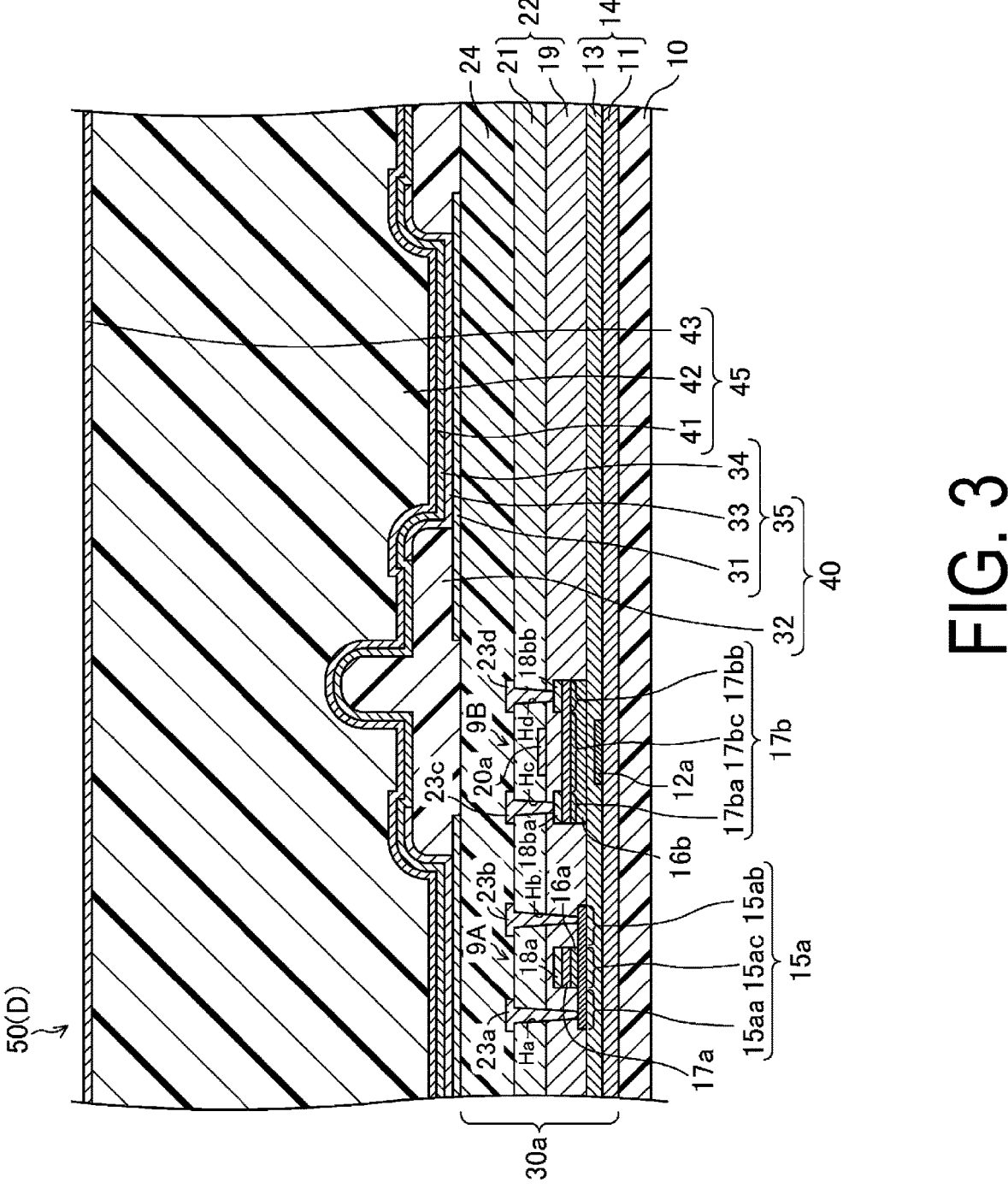
FIG. 3 is a cross-sectional view of the display region of the organic EL display device according to the first embodiment of the disclosure.
Figure 4:
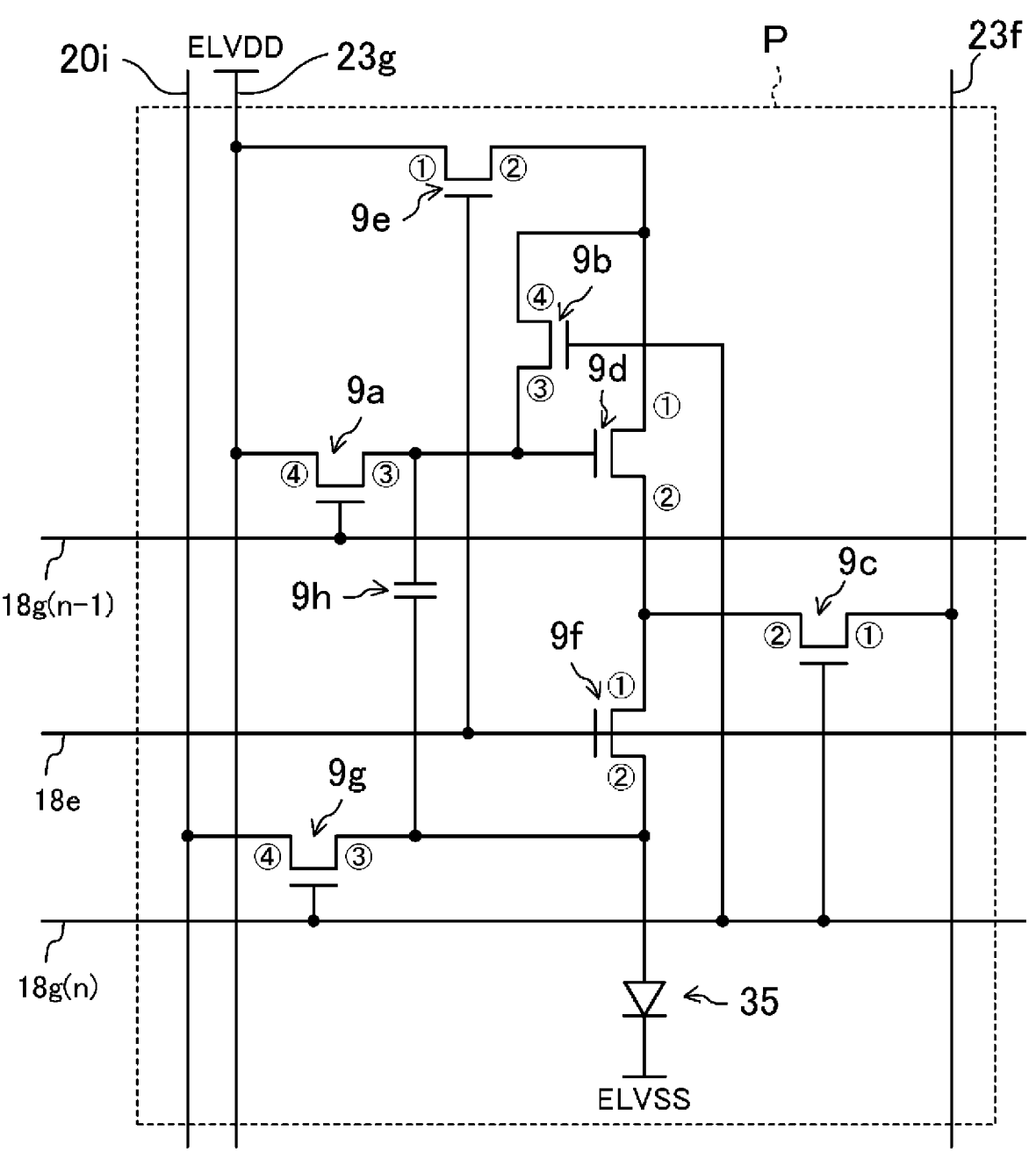
FIG. 4 is an equivalent circuit diagram illustrating a pixel circuit of the organic EL display device according to the first embodiment of the disclosure.
Figure 5:
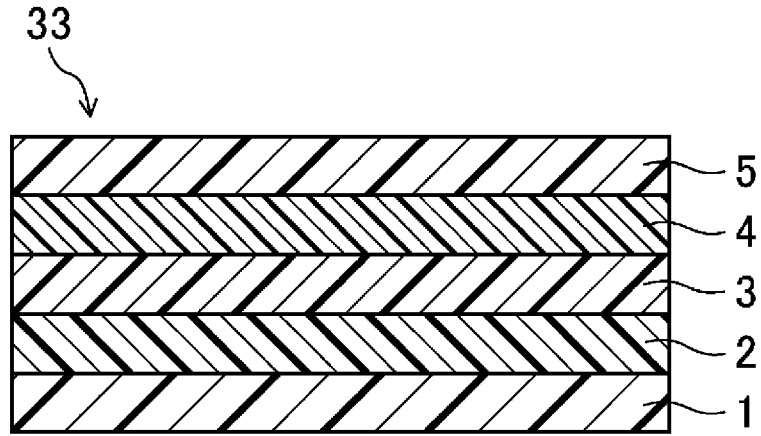
FIG. 5 is a cross-sectional view illustrating an organic EL layer constituting the organic EL display device according to the first embodiment of the disclosure.

FIG. 1 to FIG. 16 illustrate a first embodiment of a display device according to the disclosure. Note that, in each of the following embodiments, an organic EL display device will be exemplified as the display device. Here, FIG. 1 is a plan view illustrating a schematic configuration of an organic EL display device 50 according to the present embodiment. In addition, FIG. 2 is a plan view of a display region D of the organic EL display device 50. Further, FIG. 3 is a cross-sectional view of the display region D of the organic EL display device 50. FIG. 4 is an equivalent circuit diagram illustrating a pixel circuit in the organic EL display device 50. FIG. 5 is a cross-sectional view illustrating an organic EL layer 33 configuring the organic EL display device 50.

As illustrated in FIG. 1, the organic EL display device 50 includes, for example, the display region D having a rectangular shape and configured to display an image, and the frame region F provided around the display region D. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

As illustrated in FIG. 2, a plurality of subpixels P are arrayed in a matrix shape in the display region D. In addition, in the display region D, for example, a subpixel P including a red light-emitting region Er configured to display a red color, a subpixel P including a green light-emitting region Eg configured to display a green color, and a subpixel P including a blue light-emitting region Eb configured to display a blue color are provided adjacent to one another, as illustrated in FIG. 2. Note that one pixel is configured by, for example, the three adjacent subpixels P including the red light-emitting region Er, the green light-emitting region Eg, and the blue light-emitting region Eb in the display region D.

A terminal portion T is provided at the right end portion of the frame region F in FIG. 1. Further, as illustrated in FIG. 1, in the frame region F, a bendable bending portion B that can bend 180° (in a U-shape) with the vertical direction in the drawing as a bending axis is provided between the display region D and the terminal portion T to extend in one direction (the vertical direction in the drawing).

As illustrated in FIG. 3, the organic EL display device 50 includes a resin substrate layer 10 provided as a base substrate, a TFT layer 30a provided on the resin substrate layer 10, an organic EL element layer 40 provided as a light-emitting element layer on the TFT layer 30a, and a sealing film 45 provided to cover the organic EL element layer 40.

The resin substrate layer 10 is formed, for example, of a polyimide resin or the like.

As illustrated in FIG. 3, the TFT layer 30a includes a base coat film 14 provided on the resin substrate layer 10, four first TFTs 9A, three second TFTs 9B, and one capacitor 9h (see FIG. 4) provided on the base coat film 14 for each subpixel P, and a flattening film 24 provided on each first TFT 9A, each second TFT 9B, and each the capacitor 9h. Here, as illustrated in FIG. 2, in the TFT layer 30a, a plurality of gate lines 18g are provided to extend parallel to each other in the horizontal direction in the drawing. As illustrated in FIG. 2, in the TFT layer 30a, a plurality of light emission control lines 18e are provided to extend parallel to each other in the horizontal direction in the drawing. As illustrated in FIG. 2, in the TFT layer 30a, a plurality of second initialization power source lines 20i are provided to extend parallel to each other in the horizontal direction in the drawing. Note that, as illustrated in FIG. 2, each of the light emission control lines 18e is provided adjacent to a respective one of the gate lines 18g and a respective one of the second initialization power source lines 20i. As illustrated in FIG. 2, in the TFT layer 30a, a plurality of source lines 23f are provided to extend parallel to each other in the vertical direction in the drawing. As illustrated in FIG. 2, in the TFT layer 30a, a plurality of power source lines 23g are provided to extend parallel to each other in the vertical direction in the drawing. Note that, as illustrated in FIG. 2, each of the power source lines 23g is provided adjacent to a respective one of the source lines 23f.

As illustrated in FIG. 3, the first TFT 9A includes a first semiconductor layer 15a provided on the base coat film 14, a gate insulating film 16a provided on the first semiconductor layer 15a, a third semiconductor layer 17a provided on the gate insulating film 16a, a first gate electrode 18a provided on the third semiconductor layer 17a, an interlayer insulating film 22 provided to cover the first gate electrode 18a, and a first terminal electrode 23a and a second terminal electrode 23b provided on the interlayer insulating film 22 to be separated from each other.

As illustrated in FIG. 3, the base coat film 14 includes a first base coat film 11 provided on the resin substrate layer 10 side and a second base coat film 13 provided on the gate insulating film 16a side opposite to the resin substrate layer 10.

The first semiconductor layer 15a is formed of, for example, polysilicon such as low temperature polysilicon (LTPS), and as illustrated in FIG. 3, includes a first conductor region 15aa and a second conductor region 15ab defined to be separated from each other, and a first channel region 15ac defined between the first conductor region 15aa and the second conductor region 15ab.

As illustrated in FIG. 3, the gate insulating film 16a is provided to overlap the third semiconductor layer 17a and the first gate electrode 18a, the third semiconductor layer 17a and the first gate electrode 18a overlapping each other.

The third semiconductor layer 17a is formed of the same material and in the same layer as a second semiconductor layer, which will be described below.

As illustrated in FIG. 3, the first gate electrode 18a is provided to overlap the first channel region 15ac of the first semiconductor layer 15a, and is configured to control conduction between the first conductor region 15aa and the second conductor region 15ab of the first semiconductor layer 15a.

As illustrated in FIG. 3, the interlayer insulating film 22 includes a first interlayer insulating film 19 provided on the gate insulating film 16a side and a second interlayer insulating film 21 provided on the side opposite to the gate insulating film 16a.

As illustrated in FIG. 3, the first terminal electrode 23a and the second terminal electrode 23b are electrically connected to the first conductor region 15aa and the second conductor region 15ab of the first semiconductor layer 15a through a first contact hole Ha and a second contact hole Hb, respectively, formed in the interlayer insulating film 22.

As illustrated in FIG. 3, the second TFT 9B includes a gate insulating film 16b, a second semiconductor layer 17b formed on the gate insulating film 16b, a first metal layer 18ba and a second metal layer 18bb formed on a third conductor region 17ba and a fourth conductor region 17bb, respectively, which will be described below, of the second semiconductor layer 17*b*, an interlayer insulating film 22 provided on the first metal layer 18*ba* and the second metal layer 18*bb*, a third terminal electrode 23*c* and a fourth terminal electrode 23*d* provided on the interlayer insulating film 22 to be separated from each other, and a second gate electrode 20*a* and a third gate electrode 12*a* that control conduction between the third conductor region 17*ba* and the fourth conductor region 17*bb*.

As illustrated in FIG. 3, the gate insulating film 16*b* is provided separately from the gate insulating film 16*a* to overlap the second semiconductor layer 17*b*.

The second semiconductor layer 17*b* is formed of, for example, an oxide semiconductor such as In—Ga—Zn—O based, and includes, as illustrated in FIG. 3, the third conductor region 17*ba* and the fourth conductor region 17*bb* defined to be separated from each other, and a second channel region 17*bc* defined between the third conductor region 17*ba* and the fourth conductor region 17*bb*. Here, the In—Ga—Zn—O based semiconductor is ternary oxide of indium (In), gallium (Ga), and zinc (Zn), and a ratio (a composition ratio) of each of In, Ga, and Zn is not particularly limited to a specific value. The In—Ga—Zn—O based semiconductor may be an amorphous semiconductor or may be a crystalline semiconductor. Note that a crystalline In—Ga—Zn—O based semiconductor in which a c-axis is oriented substantially perpendicular to a layer surface is preferable as the crystalline In—Ga—Zn—O based semiconductor. In place of the In—Ga—Zn—O based semiconductor, another oxide semiconductor may be included. Examples of other oxide semiconductors may contain an In—Sn—Zn—O based semiconductor (for example, $In_2O_3$—$SnO_2$—ZnO; InSnZnO). The In—Sn—Zn—O based semiconductor is ternary oxide of indium (In), tin (Sn), and zinc (Zn). Alternatively, examples of other oxide semiconductors may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), and cadmium zinc oxide ($Cd_xZn_{1-x}O$). Note that as the Zn—O based semiconductor, a semiconductor in a non-crystalline (amorphous) state of ZnO to which one kind or a plurality of kinds of impurity elements among group 1 elements, group 13 elements, group 14 elements, group 15 elements, group 17 elements, and the like are added, a polycrystalline state, or a microcrystalline state in which the non-crystalline state and the polycrystalline state are mixed, or a semiconductor to which no impurity element is added can be used.

The first metal layer 18*ba* and the second metal layer 18*bb* are formed of the same material and in the same layer as the first gate electrode 18*a*.

As illustrated in FIG. 3, the third terminal electrode 23*c* and the fourth terminal electrode 23*d* are electrically connected to the first metal layer 18*ba* and the second metal layer 18*bb* through a third contact hole Hc and a fourth contact hole Hd, respectively, formed in the interlayer insulating film 22.

As illustrated in FIG. 3, the second gate electrode 20*a* is provided between the first interlayer insulating film 19 and the second interlayer insulating film 21 to overlap the second channel region 17*bc* of the second semiconductor layer 17*b*, and is configured to control conduction between the third conductor region 17*ba* and the fourth conductor region 17*bb* of the second semiconductor layer 17*b*.

As illustrated in FIG. 3, the third gate electrode 12*a* is provided between the first base coat film 11 and the second base coat film 13 to overlap the second channel region 17*bc* of the second semiconductor layer 17*b*, and is configured to control conduction between the third conductor region 17*ba* and the fourth conductor region 17*bb* of the second semiconductor layer 17*b*.

In the present embodiment, p-channel TFTs of a write TFT 9*c*, a drive TFT 9*d*, a power supply TFT 9*e*, and a light emission control TFT 9*f*, which will be described below, are exemplified as the four first TFTs 9A including the first semiconductor layer formed of polysilicon, and n-channel TFTs of an initialization TFT 9*a*, a compensation TFT 9*b*, and an anode discharge TFT 9*g*, which will be described below, are exemplified as the three second TFTs 9B including the second semiconductor layer 17*b* formed of the oxide semiconductor (see FIG. 4). Note that each of the four first TFTs 9A including the first semiconductor layer 15*a* formed of polysilicon may be the n-channel TFT. In the equivalent circuit diagram in FIG. 4, the first and second terminal electrodes 23*a* and 23*b* of each of TFTs 9*c*, 9*d*, 9*e*, and 9*f* are indicated by circled numbers 1 and 2, respectively, and the third and fourth terminal electrodes 23*c* and 23*d* of each of TFTs 9*a*, 9*b*, and 9*g* are indicated by circled numbers 3 and 4, respectively. In the equivalent circuit diagram in FIG. 4, the pixel circuit of the subpixel P in the n-th row and the m-th column is illustrated, but a part of the pixel circuit of the subpixel P in the (n−1)-th row and the m-th column is also included. In the equivalent circuit diagram in FIG. 4, the power source line 23*g* for supplying a high power supply voltage ELVDD also serves as a first initialization power source line, but the power source line 23*g* and the first initialization power source line may be provided separately. A voltage identical to a low power supply voltage ELVSS may be input to the second initialization power source line 20*i*, but this is not a limitation, and a voltage different from the low power supply voltage ELVSS and turning off the organic EL element 35 may be input.

As illustrated in FIG. 4, in each subpixel P, a gate electrode of the initialization TFT 9*a* is electrically connected to a gate line 18*g*(n−1) of the previous stage ((n−1)-th stage), a third terminal electrode of the initialization TFT 9*a* is electrically connected to a lower conductive layer of the capacitor 9*h*, which will be described below, and a gate electrode of the drive TFT 9*d*, and a fourth terminal electrode of the initialization TFT 9*a* is electrically connected to the power source line 23*g*.

As illustrated in FIG. 4, in each subpixel P, a gate electrode of the compensation TFT 9*b* is electrically connected to a gate line 18*g*(n) of the own stage (n-th stage), a third terminal electrode of the compensation TFT 9*b* is electrically connected to the gate electrode of the drive TFT 9*d*, and a fourth terminal electrode of the compensation TFT 9*b* is electrically connected to a first terminal electrode of the drive TFT 9*d*.

As illustrated in FIG. 4, in each subpixel P, a gate electrode of the write TFT 9*c* is electrically connected to a gate line 18*g*(n) of the own stage (n-th stage), a first terminal electrode of the write TFT 9*c* is electrically connected to the corresponding source line 23*f*, and a second terminal electrode of the write TFT 9*c* is electrically connected to a second terminal electrode of the drive TFT 9*d*.

As illustrated in FIG. 4, in each subpixel P, the gate electrode of the drive TFT 9*d* is electrically connected to each of third terminal electrodes of the initialization TFT 9*a* and the compensation TFT 9*b*, the first terminal electrode of the drive TFT 9*d* is electrically connected to the fourth terminal electrode of the compensation TFT 9*b* and each of second terminal electrodes of the power supply TFT 9*e*, and the second terminal electrode of the drive TFT 9*d* is electrically connected to the second terminal electrode of the write TFT 9*c* and a first terminal electrode of the light emission control TFT 9*f*. Here, the drive TFT 9*d* is configured to control the current of the organic EL element 35.

As illustrated in FIG. 4, in each subpixel P, a gate electrode of the power supply TFT 9*e* is electrically connected to the light emission control line 18*e* of the own stage (n-th stage), the first terminal electrode of the power supply TFT 9*e* is electrically connected to the power source line 23*g*, and the second terminal electrode of the power supply TFT 9*e* is electrically connected to the first terminal electrode of the drive TFT 9*d*.

As illustrated in FIG. 4, in each subpixel P, a gate electrode of the light emission control TFT 9*f* is electrically connected to the light emission control line 18*e* of the own stage (n-th stage), the first terminal electrode of the light emission control TFT 9*f* is electrically connected to the second terminal electrode of the drive TFT 9*d*, and a second terminal electrode of the light emission control TFT 9*f* is electrically connected to a first electrode 31 of the organic EL element 35, which will be described below.

As illustrated in FIG. 4, in each subpixel P, a gate electrode of the anode discharge TFT 9*g* is electrically connected to the gate line 18*g*(n) of the own stage (n-th stage), a third terminal electrode of the anode discharge TFT 9*g* is electrically connected to the first electrode 31 of the organic EL element 35, and a fourth terminal electrode of the anode discharge TFT 9*g* is electrically connected to the second initialization power source line 20*i*.

The capacitor 9*h* includes, for example, a lower conductive layer (not illustrated) formed of the same material and in the same layer as the first gate electrode 18*a*, the first interlayer insulating film 19 provided to cover the lower conductive layer, and an upper conductive layer (not illustrated) provided on the first interlayer insulating film 19 to overlap the lower conductive layer and formed of the same material and in the same layer as the second gate electrode 20*a*. As illustrated in FIG. 4, in each subpixel P, a lower conductive layer of the capacitor 9*h* is electrically connected to the gate electrode of the drive TFT 9*d* and each of the third terminal electrodes of the initialization TFT 9*a* and the compensation TFT 9*b*, an upper conductive layer of the capacitor 9*h* is electrically connected to a third terminal electrode of the anode discharge TFT 9*g*, a second terminal electrode of the light emission control TFT 9*f*, and the first electrode 31 of the organic EL element 35.

The flattening film 24 has a flat surface in the display region D, and is formed of, for example, an organic resin material such as a polyimide resin or an acrylic resin, or a spin on glass (SOG) material of a polysiloxane based.

As illustrated in FIG. 3, the organic EL element layer 40 includes a plurality of organic EL elements 35 arranged in a matrix shape as a plurality of light-emitting elements arranged to correspond to the plurality of subpixels P, and an edge cover 32 provided in a lattice pattern in common to all the subpixels P to cover a peripheral end portion of the first electrode 31, which will be described below, of each organic EL element 35.

As illustrated in FIG. 3, the organic EL element 35 includes, in each subpixel P, the first electrode 31 provided on the flattening film 24 of the TFT layer 30*a*, the organic EL layer 33 provided on the first electrode 31, and a second electrode 34 provided on the organic EL layer 33.

The first electrode 31 is electrically connected to the second terminal electrode of the light emission control TFT 9*f* of each of the subpixels P, via a contact hole formed in the flattening film 24. Further, the first electrode 31 functions to inject holes (positive holes) into the organic EL layer 33. Further, the first electrode 31 is preferably formed of a material having a large work function to improve the efficiency of hole injection into the organic EL layer 33. Here, examples of materials constituting the first electrode 31 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, examples of the materials constituting the first electrode 31 may include alloy such as astatine (At)/astatine oxide ($AtO_2$). Furthermore, examples of the materials constituting the first electrode 31 may include electrically conductive oxide such as tin oxide (SnO), zinc oxide (ZnO), indium tin oxide (ITO), and indium zinc oxide (IZO). Additionally, the first electrode 31 may be formed by layering a plurality of layers formed of any of the materials described above. Note that, examples of compound materials having a high work function include indium tin oxide (ITO) and indium zinc oxide (IZO).

The edge cover 32 is formed of, for example, an organic resin material such as a polyimide resin or an acrylic resin, or an SOG material of a polysiloxane based.

As illustrated in FIG. 5, the organic EL layer 33 includes a hole injection layer 1, a hole transport layer 2, a light-emitting layer 3, an electron transport layer 4, and an electron injection layer 5, which are sequentially provided on the first electrode 31.

The hole injection layer 1 is also referred to as an anode buffer layer, and functions to reduce an energy level difference between the first electrode 31 and the organic EL layer 33 to thereby improve the efficiency of hole injection into the organic EL layer 33 from the first electrode 31. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 31 to the organic EL layer 33. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 31 and the second electrode 34, respectively, and the holes and the electrons recombine, in a case where a voltage is applied via the first electrode 31 and the second electrode 34. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33 to thereby improve the efficiency of electron injection into the organic EL layer 33 from the second electrode 34, and this function allows the drive voltage of the organic EL element 35 to be reduced. Note that the electron injection layer 5 is also referred to as a cathode electrode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), strontium oxide (SrO), and the like.

As illustrated in FIG. 3, the second electrode 34 is provided in common to all the subpixels P to cover each of the organic EL layer 33 and the edge cover 32. Further, the second electrode 34 functions to inject electrons into the organic EL layer 33. Further, the second electrode 34 is preferably formed of a material having a small work function to improve the efficiency of electron injection into the organic EL layer 33. Here, examples of a material constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be formed of alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Further, the second electrode 34 may be formed of an electrically conductive oxide such as tin oxide (SnO), zinc oxide (ZnO), indium tin oxide (ITO), and indium zinc oxide (IZO). Further, the second electrode 34 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 45 is provided to cover the second electrode 34, and includes a first inorganic sealing film 41, an organic sealing film 42, and a second inorganic sealing film 43 sequentially layered on the second electrode 34, and has a function to protect the organic EL layer 33 of the organic EL element layer 35 from moisture and oxygen. Here, the first inorganic sealing film 41 and the second inorganic sealing film 43 include, for example, an inorganic insulating film such as a silicon nitride film, a silicon oxide film, and a silicon oxynitride film. Additionally, the organic sealing film 42 is made of, for example, an organic resin material such as an acrylic resin, an epoxy resin, a silicone resin, a polyurea resin, a parylene resin, a polyimide resin, a polyamide resin or the like.

In the organic EL display device 50 having the configuration described above, in each subpixel P, the organic EL element 35 is brought into a non-light-emitting state in a case where the light emission control line 18e is selected to be in a non-light emission state. In the non-light emission state, the gate line 18g(n−1) of the previous stage is selected, and a gate signal is input to the initialization TFT 9a via the gate line 18g(n−1), so that the initialization TFT 9a is brought into an on state, the high power supply voltage ELVDD of the power source line 23g is applied to the capacitor 9h, and the drive TFT 9d is brought into the on state. Thereby, the charge of the capacitor 9h is discharged to initialize the voltage applied to the gate electrode of the drive TFT 9d. Next, the gate line 18g(n) of the own stage is selected and activated, so that the compensation TFT 9b and the write TFT 9c are brought into the on state. A predetermined voltage corresponding to a source signal transmitted via the corresponding source line 23f is written to the capacitor 9h via the drive TFT 9d in the diode-connected state and the anode discharge TFT 9g is brought into an on state, and an initialization signal is applied to the first electrode 31 of the organic EL element 35 via the second initialization power source line 20i to reset the charge accumulated in the first electrode 31. Thereafter, the light emission control line 18e is selected, and the power supply TFT 9e and the light emission control TFT 9f are brought into the on state, so that a drive current corresponding to the voltage applied to the gate electrode of the drive TFT 9d is supplied to the organic EL element 35 from the power source line 23g. In this way, in the organic EL display device 50, in each subpixel P, the organic EL element 35 emits light at a luminance corresponding to the drive current, and the image display is performed.

Next, a method for manufacturing the organic EL display device 50 according to the present embodiment will be described. Here, FIG. 6 to FIG. 16 are cross-sectional views sequentially illustrating TFT layer forming steps in the method for manufacturing the organic EL display device 50. Note that the manufacturing method for the organic EL display device 50 includes a TFT layer forming step, an organic EL element layer forming step, and a sealing film forming step. The TFT layer forming step includes a base coat film forming step, a first semiconductor layer forming step, a layered film forming step, a resist pattern forming step, a layered film patterning step, a doping step, a metal layer forming step, an interlayer insulating film forming step, a contact hole forming step, a terminal electrode forming step, and a flattening film forming step.

TFT Layer Forming Step

First, for example, a silicon oxide film (having a thickness of about 250 nm) and a silicon nitride film (having a thickness of about 100 nm) are sequentially formed on the resin substrate layer 10 formed on a glass substrate by, for example, a plasma chemical vapor deposition (CVD) method, to form the first base coat film 11.

Figure 6:
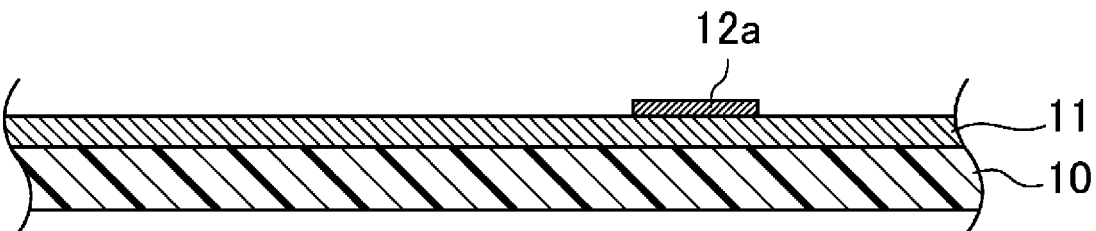
FIG. 6 is a cross-sectional view illustrating a part of a TFT layer forming step in a method for manufacturing the organic EL display device according to the first embodiment of the disclosure.

Next, a metal film such as a molybdenum film (having a thickness of about 100 nm) is formed by, for example, the sputtering method on the substrate surface on which the base coat film 11 is formed, and then the metal film is patterned to form the third gate electrode 12a as illustrated in FIG. 6.

Thereafter, a silicon oxide film (having a thickness of about 300 nm) is formed on the substrate surface on which the third gate electrode 12a is formed by plasma CVD to form the base coat film 14 including the first base coat film 11 and the second base coat film 13 (base coat film forming step).

Figure 7:
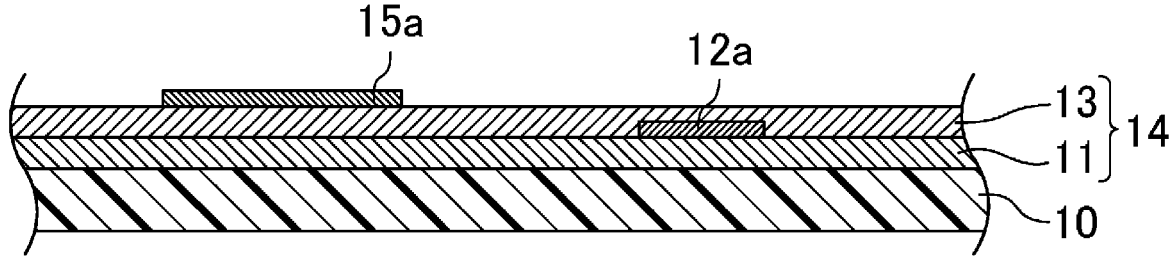
FIG. 7 is a cross-sectional view illustrating a part of the TFT layer forming step in the method for manufacturing the organic EL display device according to the first embodiment of the disclosure subsequent to FIG. 6.

Furthermore, for example, an amorphous silicon film (having a thickness of about 50 nm) is formed on the substrate surface on which the base coat film 14 is formed, by plasma CVD, the amorphous silicon film is crystallized by laser annealing or the like to form a polysilicon film, and then the polysilicon film is patterned to form the first semiconductor layer 15a as illustrated in FIG. 7 (first semiconductor layer forming step).

Figure 8:
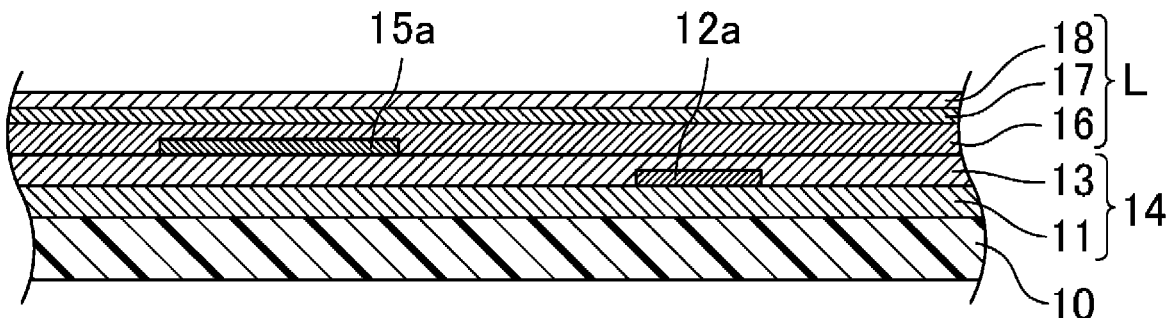
FIG. 8 is a cross-sectional view illustrating a part of the TFT layer forming step in the method for manufacturing the organic EL display device according to the first embodiment of the disclosure subsequent to FIG. 7.

Subsequently, a silicon oxide film (about 100 nm) is formed on the substrate surface on which the first semiconductor layer 15a is formed by, for example, plasma CVD to form a gate insulating film 16, and then a second semiconductor film (having a thickness of about 30 nm) 17 of InGaZnO$_4$ or the like and a metal film 18 such as a molybdenum film (having a thickness of about 100 nm) are sequentially formed by the sputtering method to form a layered film L as illustrated in FIG. 8 (layered film forming step).

Figure 9:
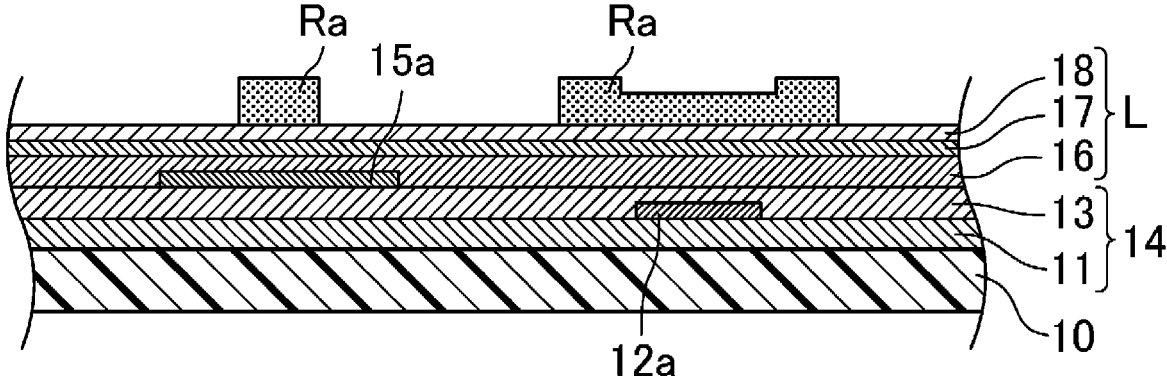
FIG. 9 is a cross-sectional view illustrating a part of the TFT layer forming step in the method for manufacturing the organic EL display device according to the first embodiment of the disclosure subsequent to FIG. 8.

Thereafter, as illustrated in FIG. 9, a resist pattern Ra is formed on the layered film L by half exposure (resist pattern forming step). Here, as illustrated in FIG. 9, the resist pattern Ra overlaps a portion to be the first channel region 15ac of the first semiconductor layer 15a and a portion to be the second semiconductor layer 17b, and a portion to be the second channel region 17bc is formed relatively thin.

Figure 10:
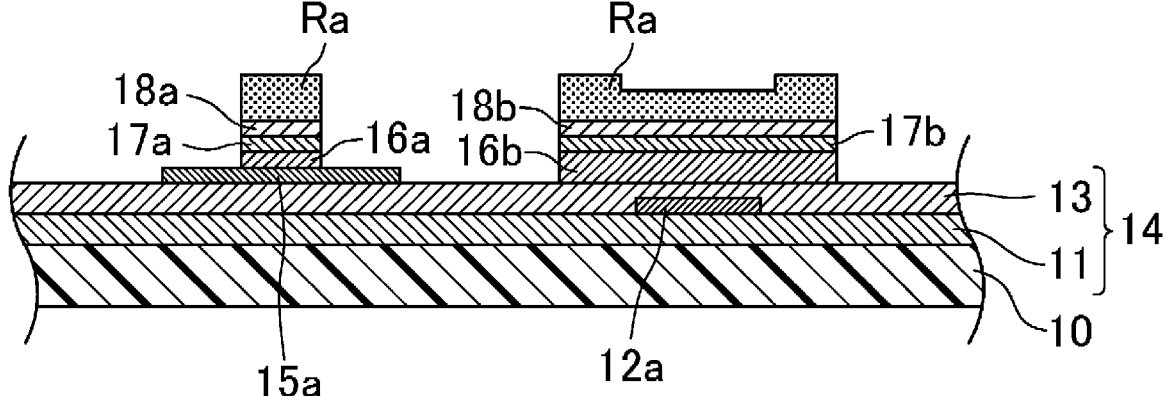
FIG. 10 is a cross-sectional view illustrating a part of the TFT layer forming step in the method for manufacturing the organic EL display device according to the first embodiment of the disclosure subsequent to FIG. 9.

Further, three layers of the metal film 18 exposed from the resist pattern Ra and the second semiconductor film 17 and the gate insulating film 16 under the metal film 18 are removed by dry etching to form the first gate electrode 18a, the third semiconductor layer 17a, the gate insulating film 16a, the metal layer 18b, the second semiconductor layer 17b and the gate insulating film 16b as illustrated in FIG. 10 (layered film patterning step). Note that in a case where the first gate electrode 18a is formed, the gate line 18g and light emission control line 18e are also formed.

Figure 11:
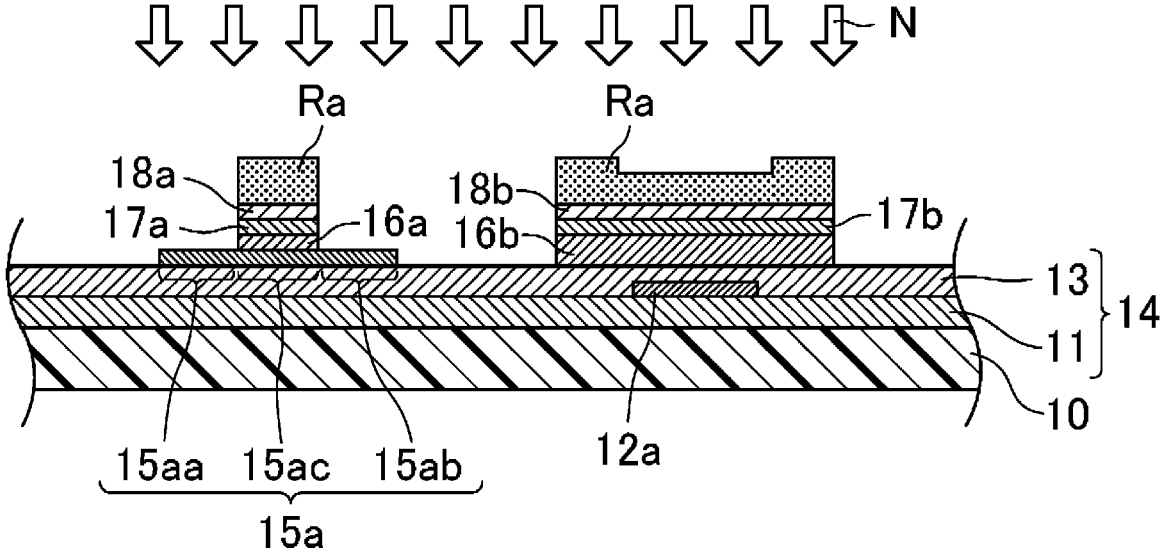
FIG. 11 is a cross-sectional view illustrating a part for the TFT layer forming step in the method for manufacturing the organic EL display device according to the first embodiment of the disclosure subsequent to FIG. 10.

Subsequently, as illustrated in FIG. 11, impurity ions N such as phosphorus, boron, or the like are doped using the resist pattern Ra as a mask to form the first conductor region 15aa, the second conductor region 15ab, and the first channel region 15ac in the first semiconductor layer 15a (doping step).

Figure 12:
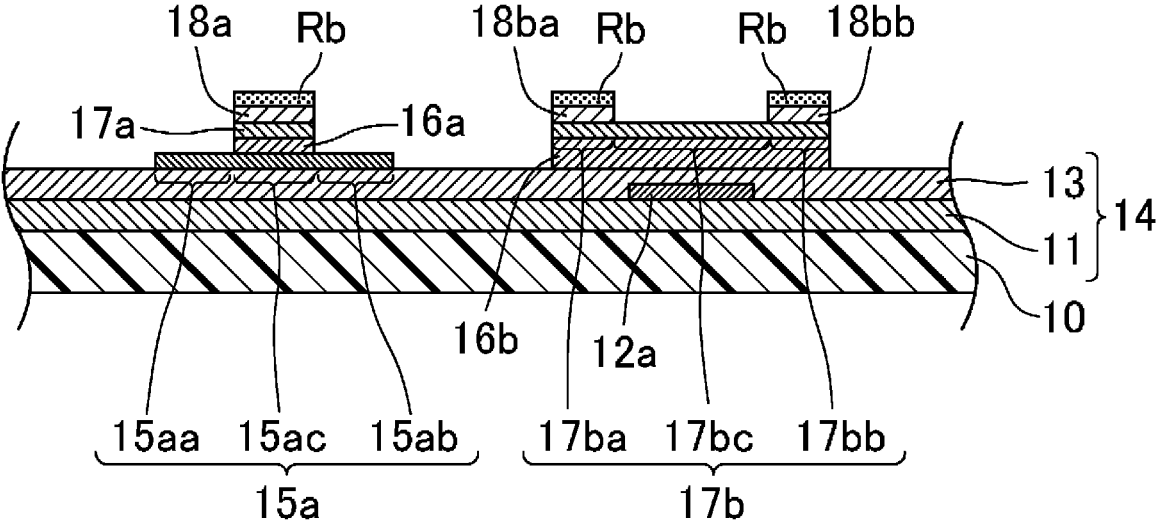
FIG. 12 is a cross-sectional view illustrating a part for the TFT layer forming step in the method for manufacturing the organic EL display device according to the first embodiment of the disclosure subsequent to FIG. 11.

Thereafter, the resist pattern Ra is thinned by ashing to be transformed into a resist pattern Rb, and then the metal film 18b exposed from the resist pattern Rb is removed by dry etching to form the first metal layer 18ba and the second metal layer 18bb as illustrated in FIG. 12 (metal layer forming step).

Figure 13:
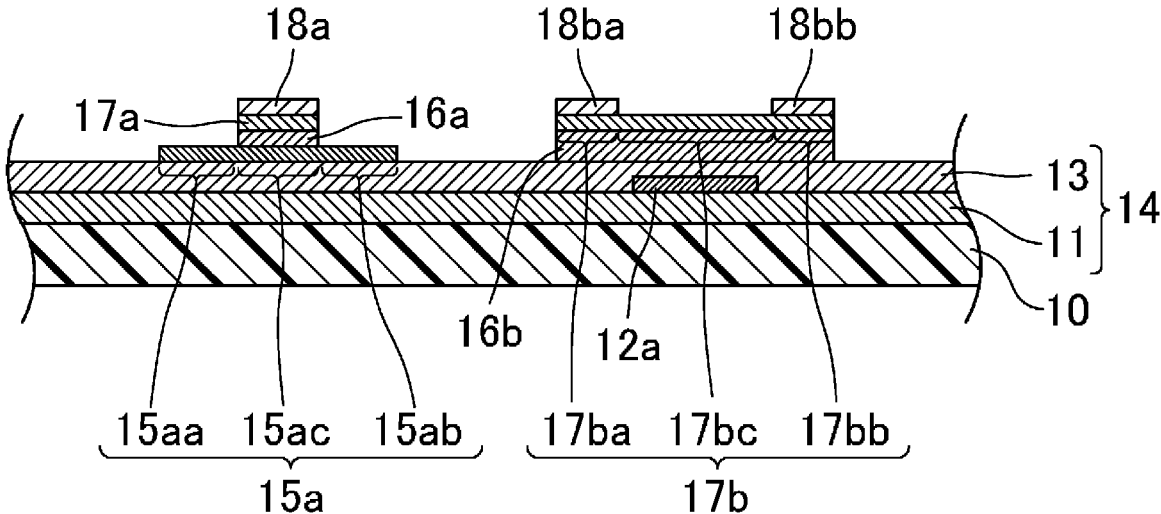
FIG. 13 is a cross-sectional view illustrating a part for the TFT layer forming step in the method for manufacturing the organic EL display device according to the first embodiment of the disclosure subsequent to FIG. 12.

Further, as illustrated in FIG. 13, the resist pattern Rb is removed by ashing, and then a silicon oxide film (about 150 nm) is formed by, for example, plasma CVD to form the first interlayer insulating film 19.

Figure 14:
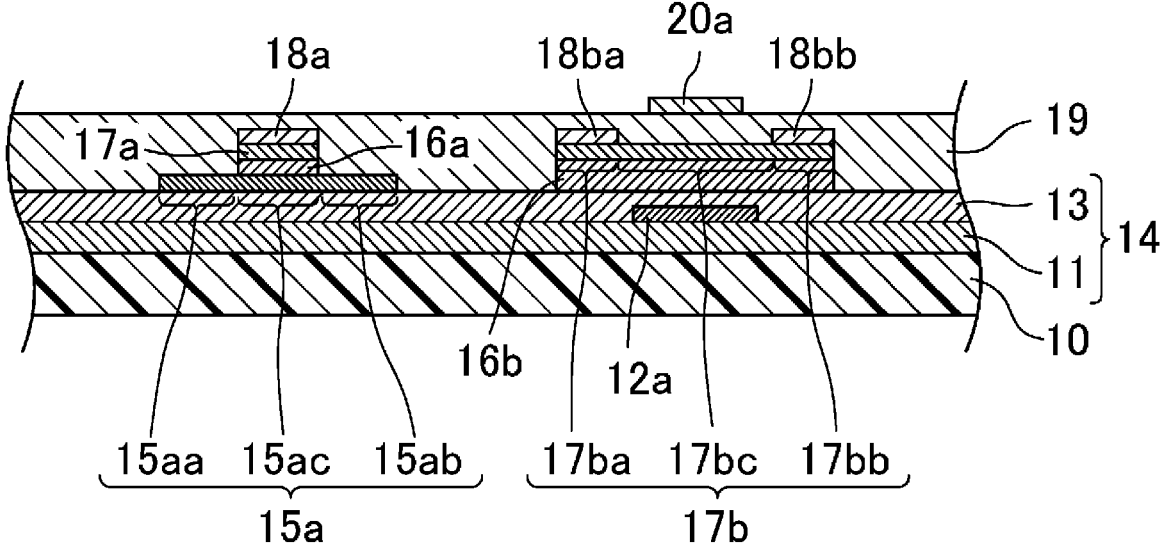
FIG. 14 is a cross-sectional view illustrating a part for the TFT layer forming step in the method for manufacturing the organic EL display device according to the first embodiment of the disclosure subsequent to FIG. 13.

Next, a metal film such as a molybdenum film (having a thickness of about 200 nm) is formed by, for example, the sputtering method on the substrate surface on which the first interlayer insulating film 19 is formed, and then the metal film is patterned to form the second gate electrode 20a as illustrated in FIG. 14. Note that in a case where the second gate electrode 20a is formed, the second initialization power source line 20i is also formed.

Figure 15:
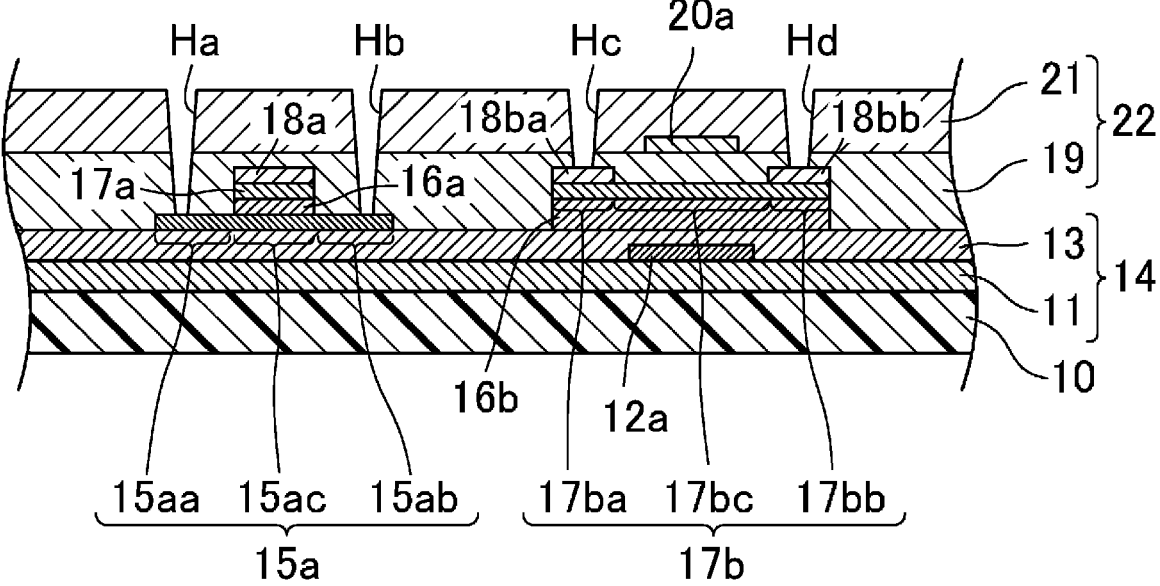
FIG. 15 is a cross-sectional view illustrating a part for the TFT layer forming step in the method for manufacturing the organic EL display device according to the first embodiment of the disclosure subsequent to FIG. 14.

Thereafter, a silicon oxide film (having a thickness of about 400 nm) is formed on the substrate surface on which the second gate electrode 20a is formed by, for example, plasma CVD to form the second interlayer insulating film 21 (interlayer insulating film forming step), and the layered film (interlayer insulating film 22) of the first interlayer insulating film 19 and the second interlayer insulating film 21 is patterned to form the first contact hole Ha, the second contact hole Hb, the third contact hole Hc, and the fourth contact hole Hd as illustrated in FIG. 15 (contact hole forming step). Note that in a case where the layered film of the first interlayer insulating film 19 and the second interlayer insulating film 21 is patterned, the layered film of the first interlayer insulating film 19 and the second interlayer insulating film 21 is patterned by dry etching, and then cleaned with hydrofluoric acid to remove a surface oxide film of the first semiconductor layer 15a disposed at bottoms of the first and second contact holes Ha and Hb, and thus the first and second contact holes Ha and Hb reaching the first and second conductor regions 15aa and 15ab, respectively, of the first semiconductor layer 15a and the third and fourth contact holes Hc and Hd reaching the first and second metal layers 18ba and 18bb, respectively, on the second semiconductor layer 17b can be reliably formed.

Figure 16:
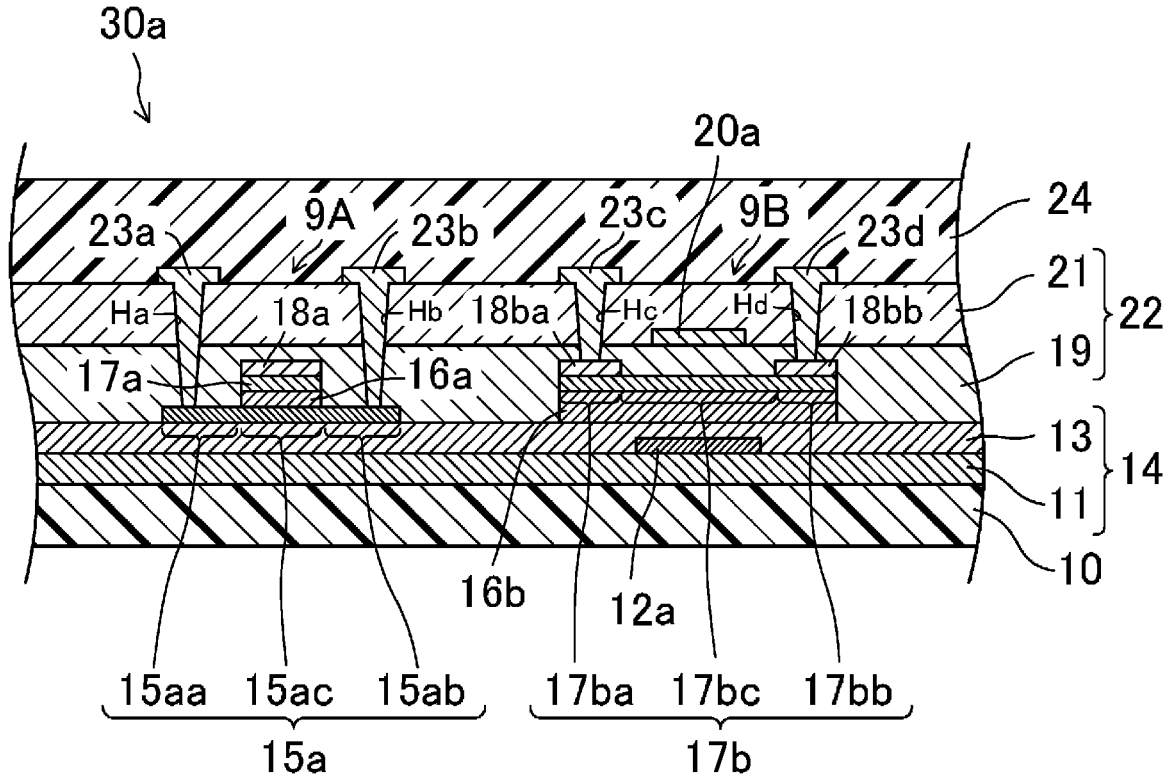
FIG. 16 is a cross-sectional view illustrating a part for the TFT layer forming step in the method for manufacturing the organic EL display device according to the first embodiment of the disclosure subsequent to FIG. 15.

Furthermore, a titanium film (having a thickness of about 50 nm), an aluminum film (having a thickness of about 400 nm), and a titanium film (having a thickness of about 50 nm) and the like are sequentially formed on the substrate surface on which the first contact hole Ha, the second contact hole Hb, the third contact hole Hc, and the fourth contact hole Hd are formed by, for example, the sputtering method to form a metal layered film (having a thickness of about 500 nm) and then the metal layered film is patterned to form the first to fourth terminal electrodes 23a, 23b, 23c, and 23d, and then a polyimide based photosensitive resin film (having a thickness of about 2 μm) is applied by, for example, the spin coating method or slit coating method, and then the applied film is subjected to prebaking, exposure, development, and postbaking to form the flattening film 24 as illustrated in FIG. 16 (terminal electrode forming step and flattening film forming step). Note that in a case where the first terminal electrode 23a and the like is formed, the source line 23f and the power source line 23g are also formed.

As described above, the TFT layer 30a can be formed.

Organic EL Element Layer Forming Step

The organic EL element layer 40 is formed by forming the first electrode 31, the edge cover 32, the organic EL layers 33 (the hole injection layer 1, the hole transport layer 2, the light-emitting layer 3, the electron transport layer 4, and the electron injection layer 5), and the second electrode 34 on the flattening film 24 of the TFT layer 30a that has been formed in the TFT layer forming step, by using a known method.

Sealing Film Forming Step

First, an inorganic insulating film such as a silicon nitride film, a silicon oxide film, or a silicon oxynitride film is formed by plasma CVD on a substrate surface formed with the organic EL element layer 40 formed in the organic EL element layer forming step by using a mask to form the first inorganic sealing film 41.

Next, on the substrate surface formed with the first inorganic sealing film 41, a film made of an organic resin material such as acrylic resin is formed by, for example, using an ink-jet method to form the organic sealing film 42.

Next, an inorganic insulating film such as a silicon nitride film, a silicon oxide film, or a silicon oxynitride film is formed by plasma CVD on the substrate formed with the organic sealing film 42 by using a mask to form the second inorganic sealing film 43, thereby forming the sealing film 45.

Finally, after a protective sheet (not illustrated) is bonded to the substrate surface on which the sealing film 45 is formed through the sealing film forming step, by emitting laser light from the glass substrate side of the resin substrate layer 10, the glass substrate is peeled off from a lower face of the resin substrate layer 10, and then, a protective sheet (not illustrated) is bonded to the lower surface of the resin substrate layer 10 from which the glass substrate has been peeled off.

The organic EL display device 50 of the present embodiment can be manufactured in the manner described above.

As described above, according to the organic EL display device 50 and the method for manufacturing the same of the present embodiment, the first TFT 9A includes the first semiconductor layer 15a formed of polysilicon, the gate insulating film 16a provided on the first semiconductor layer 15a, the third semiconductor layer 17a provided on the gate insulating film 16a, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other. Here, the first terminal electrode 23a and the second terminal electrode 23b are electrically connected to the first conductor region 15aa and the second conductor region 15ab of the first semiconductor layer 15a through the first contact hole Ha and the second contact hole Hb, respectively, formed in the interlayer insulating film 22. The second TFT 9B includes the second semiconductor layer 17b formed of the oxide semiconductor, the first metal layer 18ba and a second metal layer 18bb formed on the third conductor region 17ba and the fourth conductor region 17bb, respectively, of the second semiconductor layer 17b, the interlayer insulating film 22 provided on the first metal layer 18ba and the second metal layer 18bb, the third terminal electrode 23c and the fourth terminal electrode 23d provided on the interlayer insulating film 22 to be separated from each other, and the second gate electrode 20a that controls conduction between the third conductor region 17ba and the fourth conductor region 17bb. Here, the third terminal electrode 23c and the fourth terminal electrode 23d are electrically connected to the first metal layer 18ba and the second metal layer 18bb provided on the third conductor region 17ba and fourth conductor region 17bb of the second semiconductor layer 17b through the third contact hole Hc and the fourth contact hole Hd, respectively, formed in the interlayer insulating film 22. Thus, in the contact hole forming step, in a case where the first contact hole Ha, the second contact hole Hb, the third contact hole Hc, and the fourth contact hole Hd are formed, the second semiconductor layer 17b formed of the oxide semiconductor is not exposed. Thus, in the contact hole forming step, the interlayer insulating film 22 made of the inorganic insulating film can be cleaned with hydrofluoric acid after being patterned by dry etching, so that the first contact hole Ha and the second contact hole Hb for electrically connecting to the first semiconductor layer 15a and the third contact hole Hc and the fourth contact hole Hd for electrically connecting to the second semiconductor layer 17b can be reliably formed in the interlayer insulating film 22. Further, in the doping step, the first conductor region 15aa, the second conductor region 15ab, and the first channel region 15ac are formed in the first semiconductor layer 15a using, as the mask, the resist pattern Ra used in a case of forming the first gate electrode 18a, the third semiconductor layer 17a, and the second semiconductor layer 17b in the layered film patterning step, and in the metal layer forming step, the first metal layer 18ba and the second metal layer 18bb are formed using the resist pattern Rb obtained by thinning the resist pattern Ra, and thus the number of photomasks required for manufacturing can be reduced. Thus, a contact hole for electrically connecting to a semiconductor layer can be reliably formed in an inorganic insulating film while suppressing a manufacturing cost.

According to the organic EL display device 50 and the method for manufacturing the same of the present embodiment, in the base coat film forming step, the third gate electrode 12a that controls the conduction between the third conductor region 17ba and the fourth conductor region 17bb of the second semiconductor layer 17b is formed between the first base coat film 11 and the second base coat film 13, and thus the second TFT 9B has a double gate structure to improve the on current of the TFT, and moisture and impurity ions from the resin substrate layer 10 are blocked to suppress deterioration of the TFT.

Second Embodiment

Figure 17:
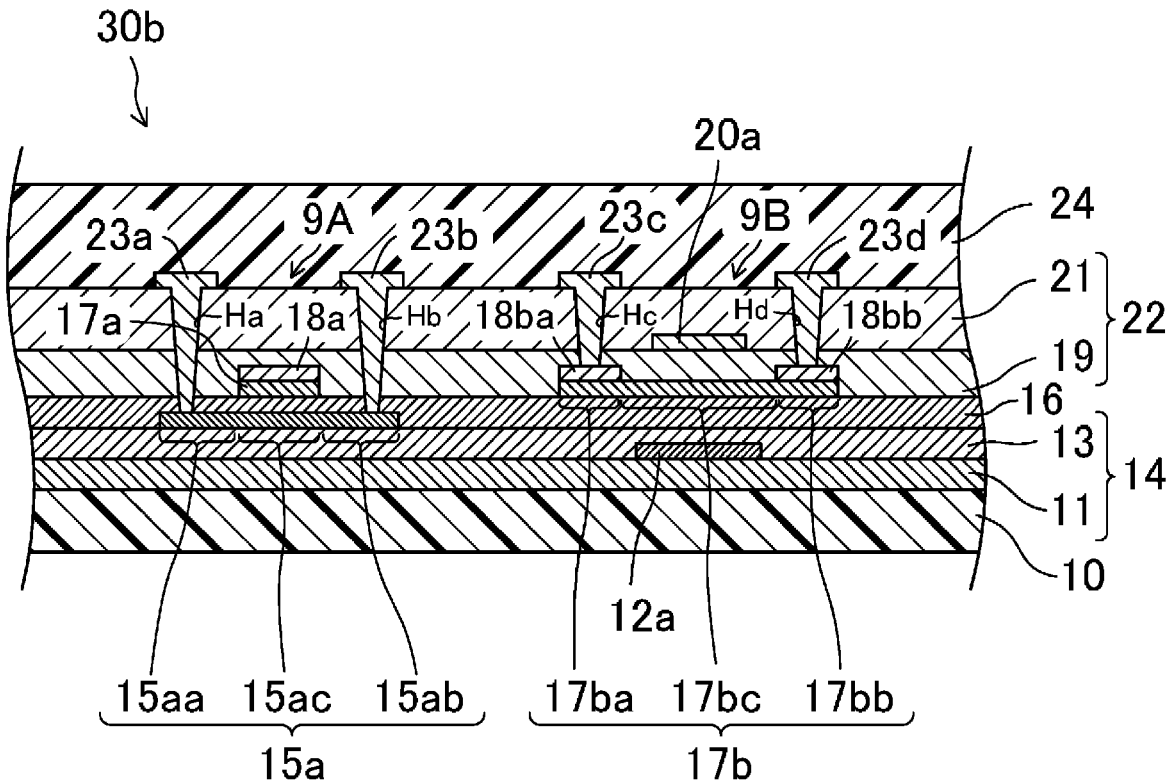
FIG. 17 is a cross-sectional view of a display region of a TFT layer included in an organic EL display device according to a second embodiment of the disclosure.

FIG. 17 illustrates a second embodiment of a display device according to the disclosure. Here, FIG. 17 is a cross-sectional view of a display region D of a TFT layer 30b included in an organic EL display device of the present embodiment. Note that, in the following embodiments, portions identical to those in FIG. 1 to FIG. 16 are denoted by the same reference signs, and their detailed descriptions are omitted.

In the first embodiment described above, the organic EL display device 50 including the TFT layer 30a provided with the gate insulating films 16a and 16b separated from each other is illustrated, but in the present embodiment, the organic EL display device including the TFT layer 30b provided with the gate insulating film 16 integrally will be illustrated.

The organic EL display device of the present embodiment includes the resin substrate layer 10, the TFT layer 30b provided on the resin substrate layer 10, the organic EL element layer 40 provided on the TFT layer 30b, and the sealing film 45 provided to cover the organic EL element layer 40.

As illustrated in FIG. 17, the TFT layer 30b includes a base coat film 14 provided on the resin substrate layer 10, four first TFTs 9A, three second TFTs 9B, and one capacitor 9h (see FIG. 4) provided on the base coat film 14 for each subpixel P, and a flattening film 24 provided on each first TFT 9A, each second TFT 9B, and each capacitor 9h. Here, similar to the TFT layer 30a of the first embodiment described above, the TFT layer 30b is provided with the plurality of gate lines 18g, the plurality of light emission control lines 18e, the plurality of second initialization power source lines 20i, the plurality of source lines 23f, and the plurality of power source lines 23g.

As illustrated in FIG. 17, the first TFT 9A includes the first semiconductor layer provided on the base coat film 14, the gate insulating film 16 provided on the first semiconductor layer 15a, the third semiconductor layer 17a provided on the gate insulating film 16, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other.

As illustrated in FIG. 17, the second TFT 9B includes a gate insulating film 16, a second semiconductor layer 17b formed on the gate insulating film 16, a first metal layer 18ba and a second metal layer 18bb formed on a third conductor region 17ba and a fourth conductor region 17bb, respectively of the second semiconductor layer 17b, an interlayer insulating film 22 provided on the first metal layer 18ba and the second metal layer 18bb, a third terminal electrode 23c and a fourth terminal electrode 23d provided on the interlayer insulating film 22 to be separated from each other, and a second gate electrode and a third gate electrode 12a that control conduction between the third conductor region 17ba and the fourth conductor region 17bb.

In the organic EL display device including the TFT layer 30b of the configuration described above, similar to the organic EL display device 50 of the first embodiment described above, in each subpixel P, the organic EL element 35 emits light at a luminance corresponding to the drive current to perform the image display.

The organic EL display device including the TFT layer 30b of the present embodiment can be manufactured, in the manufacturing method for the organic EL display device 50 of the first embodiment, by removing only the two layers of the metal film 18 exposed from the resist pattern Ra and the second semiconductor film 17 under the metal film 18 by dry etching in the layered film patterning step of the TFT layer forming step, and by patterning the layered film of the gate insulating film 16, the first interlayer insulating film 19, and the second interlayer insulating film 21 to form the first contact hole Ha and the second contact hole Hb in the contact hole forming step.

As described above, according to the organic EL display device including the TFT layer 30b and the method for manufacturing the same of the present embodiment, the first TFT 9A includes the first semiconductor layer 15a formed of polysilicon, the gate insulating film 16 provided on the first semiconductor layer 15a, the third semiconductor layer 17a provided on the gate insulating film 16, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other. Here, the first terminal electrode 23a and the second terminal electrode 23b are electrically connected to the first conductor region 15aa and the second conductor region 15ab of the first semiconductor layer 15a through the first contact hole Ha and the second contact hole Hb, respectively, formed in the gate insulating film 16 and the interlayer insulating film 22. The second TFT 9B includes the second semiconductor layer 17b formed of the oxide semiconductor, the first metal layer 18ba and a second metal layer 18bb formed on the third conductor region 17ba and the fourth conductor region 17bb, respectively, of the second semiconductor layer 17b, the interlayer insulating film 22 provided on the first metal layer 18ba and the second metal layer 18bb, the third terminal electrode 23c and the fourth terminal electrode 23d provided on the interlayer insulating film 22 to be separated from each other, and the second gate electrode 20a that controls conduction between the third conductor region 17ba and the fourth conductor region 17bb. Here, the third terminal electrode 23c and the fourth terminal electrode 23d are electrically connected to the first metal layer 18ba and the second metal layer 18bb provided on the third conductor region 17ba and fourth conductor region 17bb of the second semiconductor layer 17b through the third contact hole Hc and the fourth contact hole Hd, respectively, formed in the interlayer insulating film 22. Thus, in the contact hole forming step, in a case where the first contact hole Ha, the second contact hole Hb, the third contact hole Hc, and the fourth contact hole Hd are formed, the second semiconductor layer 17b formed of the oxide semiconductor is not exposed. Thus, in the contact hole forming step, the gate insulating film 16 and the interlayer insulating film 22 made of the inorganic insulating film can be cleaned with hydrofluoric acid after being patterned by dry etching, so that the first contact hole Ha and the second contact hole Hb for electrically connecting to the first semiconductor layer 15a and the third contact hole Hc and the fourth contact hole Hd for electrically connecting to the second semiconductor layer 17b can be reliably formed in the gate insulating film 16 and the interlayer insulating film 22, and the interlayer insulating film 22. Further, in the doping step, the first conductor region 15aa, the second conductor region 15ab, and the first channel region 15ac are formed in the first semiconductor layer 15a using, as the mask, the resist pattern Ra used in a case of forming the first gate electrode 18a, the third semiconductor layer 17a, and the second semiconductor layer 17b in the layered film patterning step, and in the metal layer forming step, the first metal layer 18ba and the second metal layer 18bb are formed using the resist pattern Rb obtained by thinning the resist pattern Ra, and thus the number of photomasks required for manufacturing can be reduced. Thus, a contact hole for electrically connecting to a semiconductor layer can be reliably formed in an inorganic insulating film while suppressing a manufacturing cost.

According to the organic EL display device including the TFT layer 30b and the method for manufacturing the same of the present embodiment, in the base coat film forming step, the third gate electrode 12a that controls the conduction between the third conductor region 17ba and the fourth conductor region 17bb of the second semiconductor layer 17b is formed between the first base coat film 11 and the second base coat film 13, and thus the second TFT 9B can be a double gate structure.

Third Embodiment

Figure 18:
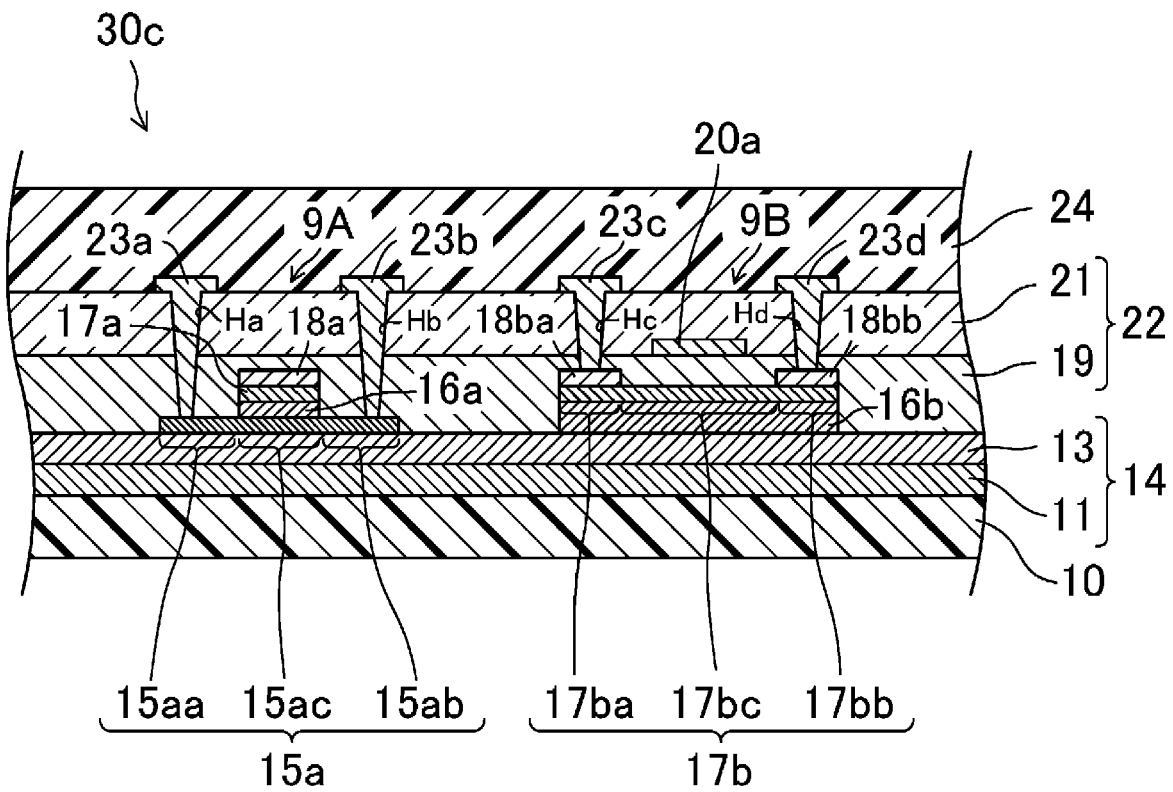
FIG. 18 is a cross-sectional view of a display region of a TFT layer included in an organic EL display device according to a third embodiment of the disclosure.

FIG. 18 illustrates a third embodiment of a display device according to the disclosure. Here, FIG. 18 is a cross-sectional view of a display region D of a TFT layer included in an organic EL display device of the present embodiment.

In the first and second embodiments described above, the organic EL display device including the TFT layers 30a and 30b provided with the second TFT 9B having the double gate structure, but in the present embodiment, the organic EL display device including the TFT layer 30c provided with the second TFT 9B having the top gate structure will be illustrated.

The organic EL display device of the present embodiment includes the resin substrate layer 10, the TFT layer 30c provided on the resin substrate layer 10, the organic EL element layer 40 provided on the TFT layer 30c, and the sealing film 45 provided to cover the organic EL element layer 40.

As illustrated in FIG. 18, the TFT layer 30c includes a base coat film 14 provided on the resin substrate layer 10, four first TFTs 9A, three second TFTs 9B, and one capacitor 9h (see FIG. 4) provided on the base coat film 14 for each subpixel P, and a flattening film 24 provided on each first TFT 9A, each second TFT 9B, and each the capacitor 9h. Here, similar to the TFT layer 30a of the first embodiment described above, the TFT layer 30c is provided with the plurality of gate lines 18g, the plurality of light emission control lines 18e, the plurality of second initialization power source lines 20i, the plurality of source lines 23f, and the plurality of power source lines 23g.

As illustrated in FIG. 18, the first TFT 9A includes the first semiconductor layer provided on the base coat film 14, the gate insulating film 16a provided on the first semiconductor layer 15a, the third semiconductor layer 17a provided on the gate insulating film 16a, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other.

As illustrated in FIG. 18, the second TFT 9B includes the gate insulating film 16b, the second semiconductor layer 17b formed on the gate insulating film 16b, the first metal layer 18ba and the second metal layer 18bb formed on the third conductor region 17ba and the fourth conductor region 17bb, respectively, of the second semiconductor layer 17b, the interlayer insulating film 22 provided on the first metal layer 18ba and the second metal layer 18bb, the third terminal electrode 23c and the fourth terminal electrode 23d provided on the interlayer insulating film 22 to be separated from each other, and the second gate electrode 20a that controls conduction between the third conductor region 17ba and the fourth conductor region 17bb.

In the organic EL display device including the TFT layer 30c of the configuration described above, similar to the organic EL display device 50 of the first embodiment described above, in each subpixel P, the organic EL element 35 emits light at a luminance corresponding to the drive current, and the image display is performed.

The organic EL display device including the TFT layer 30c of the present embodiment can be manufactured by forming the metal film such as the molybdenum film and then patterning the metal film to omit the forming the third gate electrode 12a in the base coat film forming step of the TFT layer forming step in the manufacturing method for the organic EL display device 50 of the first embodiment.

As described above, according to the organic EL display device including the TFT layer 30c and the method for manufacturing the same of the present embodiment, the first TFT 9A includes the first semiconductor layer 15a formed of polysilicon, the gate insulating film 16a provided on the first semiconductor layer 15a, the third semiconductor layer 17a provided on the gate insulating film 16a, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other. Here, the first terminal electrode 23a and the second terminal electrode 23b are electrically connected to the first conductor region 15aa and the second conductor region 15ab of the first semiconductor layer 15a through the first contact hole Ha and the second contact hole Hb, respectively, formed in the interlayer insulating film 22. The second TFT 9B includes the second semiconductor layer 17b formed of the oxide semiconductor, the first metal layer 18ba and a second metal layer 18bb formed on the third conductor region 17ba and the fourth conductor region 17bb, respectively, of the second semiconductor layer 17b, the interlayer insulating film 22 provided on the first metal layer 18ba and the second metal layer 18bb, the third terminal electrode 23c and the fourth terminal electrode 23d provided on the interlayer insulating film 22 to be separated from each other, and the second gate electrode 20a that controls conduction between the third conductor region 17ba and the fourth conductor region 17bb. Here, the third terminal electrode 23c and the fourth terminal electrode 23d are electrically connected to the first metal layer 18ba and the second metal layer 18bb provided on the third conductor region 17ba and fourth conductor region 17bb of the second semiconductor layer 17b through the third contact hole Hc and the fourth contact hole Hd, respectively, formed in the interlayer insulating film 22. Thus, in the contact hole forming step, in a case where the first contact hole Ha, the second contact hole Hb, the third contact hole Hc, and the fourth contact hole Hd are formed, the second semiconductor layer 17b formed of the oxide semiconductor is not exposed. Thus, in the contact hole forming step, the interlayer insulating film 22 made of the inorganic insulating film can be cleaned with hydrofluoric acid after being patterned by dry etching, so that the first contact hole Ha and the second contact hole Hb for electrically connecting to the first semiconductor layer 15a and the third contact hole Hc and the fourth contact hole Hd for electrically connecting to the second semiconductor layer 17b can be reliably formed in the interlayer insulating film 22. Further, in the doping step, the first conductor region 15aa, the second conductor region 15ab, and the first channel region 15ac are formed in the first semiconductor layer 15a using, as the mask, the resist pattern Ra used in a case of forming the first gate electrode 18a, the third semiconductor layer 17a, and the second semiconductor layer 17b in the layered film patterning step, and in the metal layer forming step, the first metal layer 18ba and the second metal layer 18bb are formed using the resist pattern Rb obtained by thinning the resist pattern Ra, and thus the number of photomasks required for manufacturing can be reduced. Thus, a contact hole for electrically connecting to a semiconductor layer can be reliably formed in an inorganic insulating film while suppressing a manufacturing cost.

Fourth Embodiment

Figure 19:
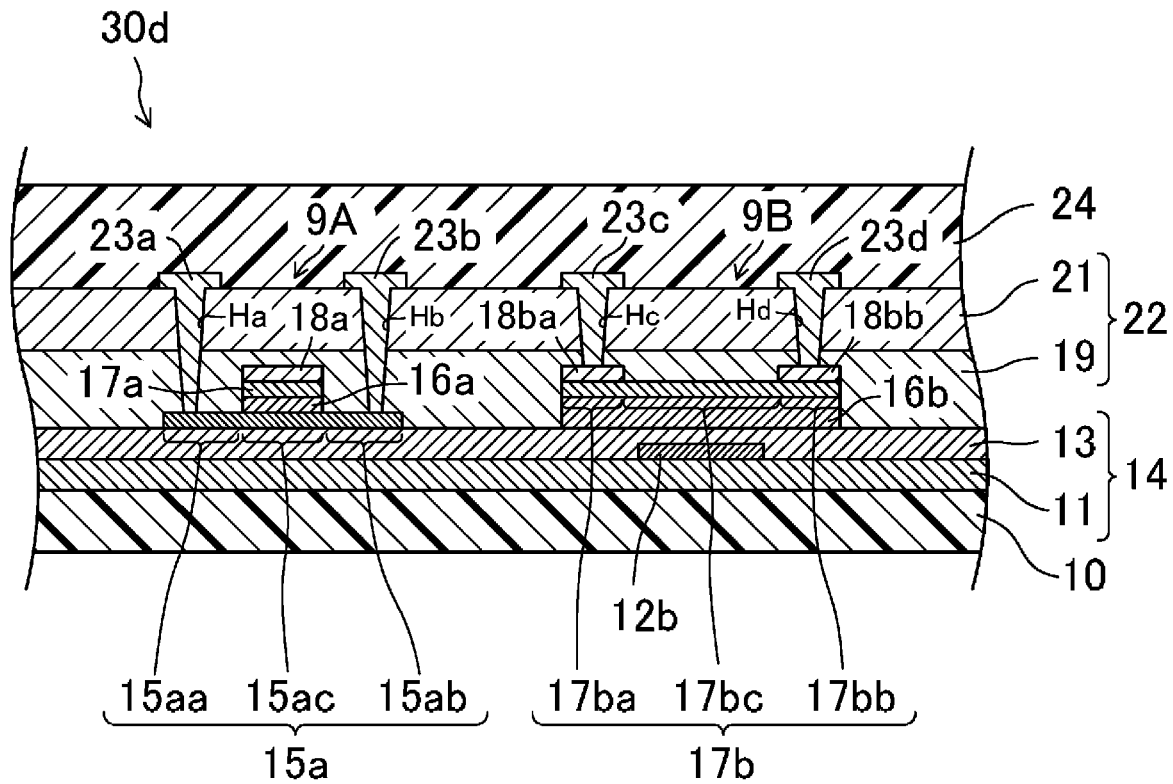
FIG. 19 is a cross-sectional view of a display region of a TFT layer included in an organic EL display device according to a fourth embodiment of the disclosure.

FIG. 19 illustrate a fourth embodiment of a display device according to the disclosure. Here, FIG. 19 is a cross-sectional view of a display region D of a TFT layer 30d included in an organic EL display device of the present embodiment.

In the third embodiment described above, the organic EL display device including the TFT layers 30c provided with the second TFT 9B having the top gate structure, but in the present embodiment, the organic EL display device including the TFT layer 30d provided with the second TFT 9B having the bottom gate structure will be illustrated.

The organic EL display device of the present embodiment includes the resin substrate layer 10, the TFT layer 30d provided on the resin substrate layer 10, the organic EL element layer 40 provided on the TFT layer 30*d*, and the sealing film 45 provided to cover the organic EL element layer 40.

As illustrated in FIG. 19, the TFT layer 30*d* includes a base coat film 14 provided on the resin substrate layer 10, four first TFTs 9A, three second TFTs 9B, and one capacitor 9*h* (see FIG. 4) provided on the base coat film 14 for each subpixel P, and a flattening film 24 provided on each first TFT 9A, each second TFT 9B, and each the capacitor 9*h*. Here, similar to the TFT layer 30*a* of the first embodiment, the TFT layer is provided with the plurality of gate lines 18*g*, the plurality of light emission control lines 18*e*, the plurality of second initialization power source lines 20*i*, the plurality of source lines 23*f*, and the plurality of power source lines 23*g*.

As illustrated in FIG. 19, the first TFT 9A includes the first semiconductor layer provided on the base coat film 14, the gate insulating film 16*a* provided on the first semiconductor layer 15*a*, the third semiconductor layer 17*a* provided on the gate insulating film 16*a*, the first gate electrode 18*a* provided on the third semiconductor layer 17*a*, the interlayer insulating film 22 provided to cover the first gate electrode 18*a*, and the first terminal electrode 23*a* and the second terminal electrode 23*b* provided on the interlayer insulating film 22 to be separated from each other.

As illustrated in FIG. 19, the second TFT 9B includes the gate insulating film 16*b*, the second semiconductor layer 17*b* formed on the gate insulating film 16*b*, the first metal layer 18*ba* and the second metal layer 18*bb* formed on the third conductor region 17*ba* and the fourth conductor region 17*bb*, respectively, of the second semiconductor layer 17*b*, the interlayer insulating film 22 provided on the first metal layer 18*ba* and the second metal layer 18*bb*, the third terminal electrode 23*c* and the fourth terminal electrode 23*d* provided on the interlayer insulating film 22 to be separated from each other, and the second gate electrode 12*b* that controls conduction between the third conductor region 17*ba* and the fourth conductor region 17*bb*. Here, the second gate electrode 12*b* is substantially the same as the third gate electrode 12*a* in the TFT layer of the first embodiment described above.

In the organic EL display device including the TFT layer 30*d* of the configuration described above, similar to the organic EL display device 50 of the first embodiment described above, in each subpixel P, the organic EL element 35 emits light at a luminance corresponding to the drive current, and the image display is performed.

The organic EL display device including the TFT layer 30*d* of the present embodiment can be manufactured by forming the metal film such as the molybdenum film and then patterning the metal film to omit the forming the second gate electrode 20*a* in the interlayer insulating film forming step of the TFT layer forming step in the manufacturing method for the organic EL display device 50 of the first embodiment.

As described above, according to the organic EL display device including the TFT layer 30*d* and the method for manufacturing the same of the present embodiment, the first TFT 9A includes the first semiconductor layer 15*a* formed of polysilicon, the gate insulating film 16*a* provided on the first semiconductor layer 15*a*, the third semiconductor layer 17*a* provided on the gate insulating film 16*a*, the first gate electrode 18*a* provided on the third semiconductor layer 17*a*, the interlayer insulating film 22 provided to cover the first gate electrode 18*a*, and the first terminal electrode 23*a* and the second terminal electrode 23*b* provided on the interlayer insulating film 22 to be separated from each other. Here, the first terminal electrode 23*a* and the second terminal electrode 23*b* are electrically connected to the first conductor region 15*aa* and the second conductor region 15*ab* of the first semiconductor layer 15*a* through the first contact hole Ha and the second contact hole Hb, respectively, formed in the interlayer insulating film 22. The second TFT 9B includes the second semiconductor layer 17*b* formed of the oxide semiconductor, the first metal layer 18*ba* and a second metal layer 18*bb* formed on the third conductor region 17*ba* and the fourth conductor region 17*bb*, respectively, of the second semiconductor layer 17*b*, the interlayer insulating film 22 provided on the first metal layer 18*ba* and the second metal layer 18*bb*, the third terminal electrode 23*c* and the fourth terminal electrode 23*d* provided on the interlayer insulating film 22 to be separated from each other, and the second gate electrode 12*b* that controls conduction between the third conductor region 17*ba* and the fourth conductor region 17*bb*. Here, the third terminal electrode 23*c* and the fourth terminal electrode 23*d* are electrically connected to the first metal layer 18*ba* and the second metal layer 18*bb* provided on the third conductor region 17*ba* and fourth conductor region 17*bb* of the second semiconductor layer 17*b* through the third contact hole Hc and the fourth contact hole Hd, respectively, formed in the interlayer insulating film 22. Thus, in the contact hole forming step, in a case where the first contact hole Ha, the second contact hole Hb, the third contact hole Hc, and the fourth contact hole Hd are formed, the second semiconductor layer 17*b* formed of the oxide semiconductor is not exposed. Thus, in the contact hole forming step, the interlayer insulating film 22 made of the inorganic insulating film can be cleaned with hydrofluoric acid after being patterned by dry etching, so that the first contact hole Ha and the second contact hole Hb for electrically connecting to the first semiconductor layer 15*a* and the third contact hole Hc and the fourth contact hole Hd for electrically connecting to the second semiconductor layer 17*b* can be reliably formed in the interlayer insulating film 22. Further, in the doping step, the first conductor region 15*aa*, the second conductor region 15*ab*, and the first channel region 15*ac* are formed in the first semiconductor layer 15*a* using, as the mask, the resist pattern Ra used in a case of forming the first gate electrode 18*a*, the third semiconductor layer 17*a*, and the second semiconductor layer 17*b* in the layered film patterning step, and in the metal layer forming step, the first metal layer 18*ba* and the second metal layer 18*bb* are formed using the resist pattern Rb obtained by thinning the resist pattern Ra, and thus the number of photomasks required for manufacturing can be reduced. Thus, a contact hole for electrically connecting to a semiconductor layer can be reliably formed in an inorganic insulating film while suppressing a manufacturing cost.

Fifth Embodiment

Figure 20:
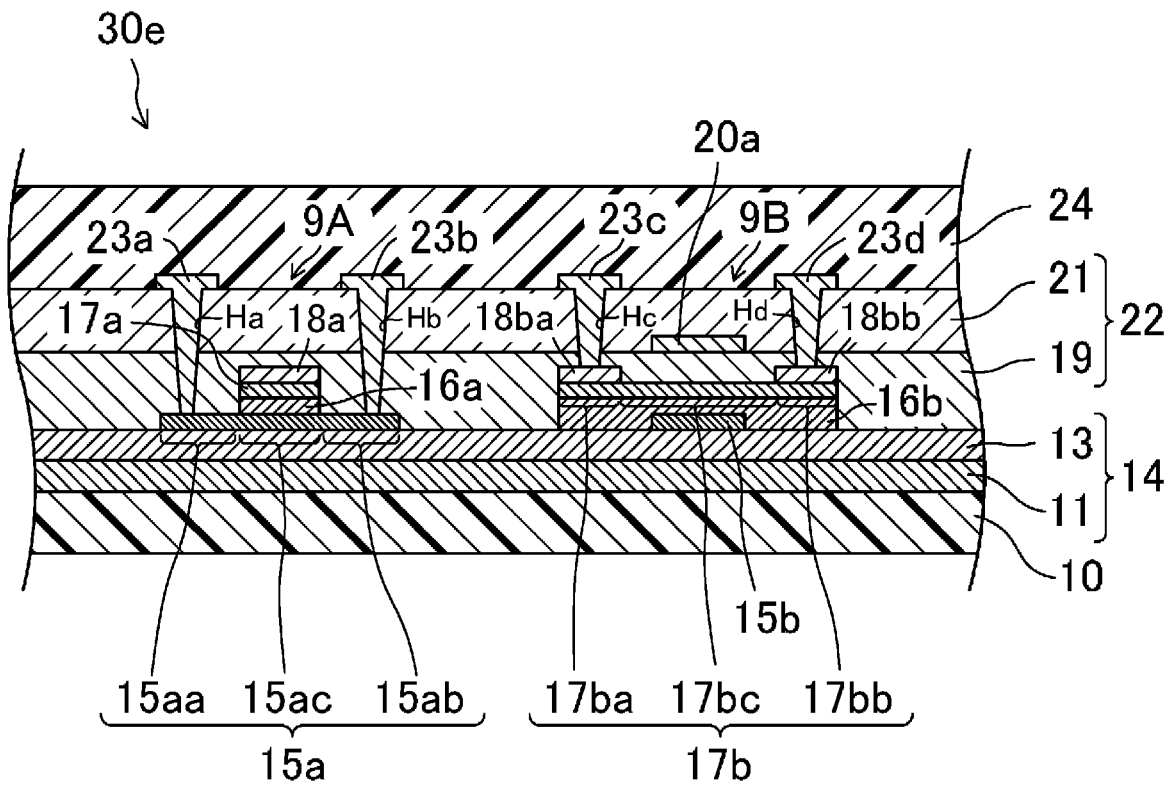
FIG. 20 is a cross-sectional view of a display region of a TFT layer included in an organic EL display device according to a fifth embodiment of the disclosure.

FIG. 20 illustrates a display device according to a fifth embodiment of the disclosure. Here, FIG. 20 is a cross-sectional view of a display region D of a TFT layer 30*e* included in an organic EL display device of the present embodiment.

In the first embodiment described above, the organic EL display device 50 including the TFT layer 30*a* provided with the third gate electrode 12*a* on the gate insulating film 16*b* side of the second semiconductor layer 17*b* is illustrated, but in the present embodiment, the organic EL display device including the TFT layer 30*e* provided with a light blocking layer 15b on the gate insulating film 16b side of the second semiconductor layer 17b will be illustrated.

The organic EL display device of the present embodiment includes the resin substrate layer 10, the TFT layer 30e provided on the resin substrate layer 10, the organic EL element layer 40 provided on the TFT layer 30e, and the sealing film 45 provided to cover the organic EL element layer 40.

As illustrated in FIG. 20, the TFT layer 30e includes a base coat film 14 provided on the resin substrate layer 10, four first TFTs 9A, three second TFTs 9B, and one capacitor 9h (see FIG. 4) provided on the base coat film 14 for each subpixel P, and a flattening film 24 provided on each first TFT 9A, each second TFT 9B, and each the capacitor 9h. Here, similar to the TFT layer 30a of the first embodiment described above, the TFT layer 30e is provided with the plurality of gate lines 18g, the plurality of light emission control lines 18e, the plurality of second initialization power source lines 20i, the plurality of source lines 23f, and the plurality of power source lines 23g.

As illustrated in FIG. 20, the first TFT 9A includes the first semiconductor layer provided on the base coat film 14, the gate insulating film 16a provided on the first semiconductor layer 15a, the third semiconductor layer 17a provided on the gate insulating film 16a, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other.

As illustrated in FIG. 20, the second TFT 9B includes the light blocking layer 15b, the gate insulating film 16b provided to cover the light blocking layer 15b, the second semiconductor layer 17b formed on the gate insulating film 16b, the first metal layer 18ba and the second metal layer 18bb formed on the third conductor region 17ba and a fourth conductor region 17bb, respectively, of the second semiconductor layer 17b, the interlayer insulating film 22 provided on the first metal layer 18ba and the second metal layer 18bb, the third terminal electrode 23c and the fourth terminal electrode 23d provided on the interlayer insulating film 22 to be separated from each other, and the second gate electrode 20a that controls conduction between the third conductor region 17ba and the fourth conductor region 17bb. Here, as illustrated in FIG. 20, the light blocking layer 15b is provided to overlap the second channel region 17bc of the second semiconductor layer 17b, and is formed of the same material and in the same layer as the first semiconductor layer 15a.

In the organic EL display device including the TFT layer 30e of the configuration described above, similar to the organic EL display device 50 of the first embodiment described above, in each subpixel P, the organic EL element 35 emits light at a luminance corresponding to the drive current, and the image display is performed.

The organic EL display device including the TFT layer 30e of the present embodiment can be manufactured in the manufacturing method for the organic EL display device 50 of the first embodiment by forming the metal film such as the molybdenum film or the like and then patterning the metal film to omit the forming the third gate electrode 12a in the base coat film forming step of the TFT layer forming step and by forming the light blocking layer 15b simultaneously with the first semiconductor layer in the first semiconductor layer forming step.

As described above, according to the organic EL display device including the TFT layer 30e and the method for manufacturing the same of the present embodiment, the first TFT 9A includes the first semiconductor layer 15a formed of polysilicon, the gate insulating film 16a provided on the first semiconductor layer 15a, the third semiconductor layer 17a provided on the gate insulating film 16a, the first gate electrode 18a provided on the third semiconductor layer 17a, the interlayer insulating film 22 provided to cover the first gate electrode 18a, and the first terminal electrode 23a and the second terminal electrode 23b provided on the interlayer insulating film 22 to be separated from each other. Here, the first terminal electrode 23a and the second terminal electrode 23b are electrically connected to the first conductor region 15aa and the second conductor region 15ab of the first semiconductor layer 15a through the first contact hole Ha and the second contact hole Hb, respectively, formed in the interlayer insulating film 22. The second TFT 9B includes the second semiconductor layer 17b formed of the oxide semiconductor, the first metal layer 18ba and a second metal layer 18bb formed on the third conductor region 17ba and the fourth conductor region 17bb, respectively, of the second semiconductor layer 17b, the interlayer insulating film 22 provided on the first metal layer 18ba and the second metal layer 18bb, the third terminal electrode 23c and the fourth terminal electrode 23d provided on the interlayer insulating film 22 to be separated from each other, and the second gate electrode 20a that controls conduction between the third conductor region 17ba and the fourth conductor region 17bb. Here, the third terminal electrode 23c and the fourth terminal electrode 23d are electrically connected to the first metal layer 18ba and the second metal layer 18bb provided on the third conductor region 17ba and fourth conductor region 17bb of the second semiconductor layer 17b through the third contact hole Hc and the fourth contact hole Hd, respectively, formed in the interlayer insulating film 22. Thus, in the contact hole forming step, in a case where the first contact hole Ha, the second contact hole Hb, the third contact hole Hc, and the fourth contact hole Hd are formed, the second semiconductor layer 17b formed of the oxide semiconductor is not exposed. Thus, in the contact hole forming step, the interlayer insulating film 22 made of the inorganic insulating film can be cleaned with hydrofluoric acid after being patterned by dry etching, so that the first contact hole Ha and the second contact hole Hb for electrically connecting to the first semiconductor layer 15a and the third contact hole Hc and the fourth contact hole Hd for electrically connecting to the second semiconductor layer 17b can be reliably formed in the interlayer insulating film 22. Further, in the doping step, the first conductor region 15aa, the second conductor region 15ab, and the first channel region 15ac are formed in the first semiconductor layer 15a using, as the mask, the resist pattern Ra used in a case of forming the first gate electrode 18a, the third semiconductor layer 17a, and the second semiconductor layer 17b in the layered film patterning step, and in the metal layer forming step, the first metal layer 18ba and the second metal layer 18bb are formed using the resist pattern Rb obtained by thinning the resist pattern Ra, and thus the number of photomasks required for manufacturing can be reduced. Thus, a contact hole for electrically connecting to a semiconductor layer can be reliably formed in an inorganic insulating film while suppressing a manufacturing cost.

According to the organic EL display device including the TFT layer 30e and the method for manufacturing the same of the present embodiment, since the light blocking layer 15b is provided on the gate insulating film 16b side of the second semiconductor layer 17*b*, stray light due to multiple reflection of light incident into the subpixel P can be suppressed.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device is exemplified as the display device, but the disclosure is also applicable to a display device such as a liquid crystal display device employing an active matrix driving method.

In each of the above-described embodiments, the resin substrate layer is exemplified as the base substrate, but the base substrate may be a glass substrate or the like.

In each of the above-described embodiments, the display device is exemplified in which the first TFT and the second TFT are provided for each subpixel of the display region, but the disclosure can also be applied to a display device in which, for example, a p-channel type first TFT and an n-channel type second TFT are combined to form a complementary metal oxide semiconductor (CMOS), and the first TFT and the second TFT are provided as a driving circuit in the frame region.

In each of the above-described embodiments, the display device including various TFT layers is exemplified, but the disclosure is also applied to a display device in which characteristic portions of the TFT layers of the respective embodiments may be combined.

In addition, in each of the embodiments described above, the organic EL display device is exemplified and described as a display device. The disclosure is also applicable to a display device including a plurality of light-emitting elements that are driven by an electrical current. For example, the disclosure is applicable to a display device including quantum-dot light emitting diodes (QLEDs) that are light-emitting elements using a quantum dot-containing layer.

INDUSTRIAL APPLICABILITY

As described above, the disclosure is useful for a flexible display device.

The invention claimed is:

1. A display device comprising:
a base substrate; and
a thin film transistor layer provided on the base substrate, wherein:
in the thin film transistor layer, a first thin film transistor, including a first semiconductor layer formed of poly-silicon, and a second thin film transistor, including a second semiconductor layer formed of an oxide semiconductor, are provided for each subpixel, the first thin film transistor includes:
the first semiconductor layer provided on a base coat film and including a first conductor region and a second conductor region that are separated from each other,
a gate insulating film provided on the first semiconductor layer,
a third semiconductor layer provided on the gate insulating film and formed of the same material, and in the same layer, as the second semiconductor layer,
a first gate electrode provided on the third semiconductor layer and configured to control conduction between the first conductor region and the second conductor region,
an interlayer insulating film that covers the first gate electrode, and
a first terminal electrode and a second terminal electrode that are provided on the interlayer insulating film, that are separated from each other, and that are electrically connected to the first conductor region and the second conductor region, respectively, and
the second thin film transistor includes:
the gate insulating film,
the second semiconductor layer provided on the gate insulating film and including a third conductor region and a fourth conductor region that are separated from each other,
a first metal layer and a second metal layer provided on the third conductor region and the fourth conductor region, respectively, and formed of the same material, and in the same layer, as the first gate electrode,
the interlayer insulating film provided on the first metal layer and the second metal layer,
a third terminal electrode and a fourth terminal electrode that are provided on the interlayer insulating film, that are separated from each other, and that are electrically connected to the first metal layer and the second metal layer, respectively, and
a second gate electrode configured to control conduction between the third conductor region and the fourth conductor region,
the interlayer insulating film includes a first interlayer insulating film, provided on a gate insulating film side, and a second interlayer insulating film, provided on a side opposite the gate insulating film side, and
the second gate electrode is provided between the first interlayer insulating film and the second interlayer insulating film.

2. The display device according to claim 1, wherein the third semiconductor layer and the first gate electrode overlap each other.

3. The display device according to claim 1, wherein the gate insulating film of the first thin film transistor is provided separately from the gate insulating film of the second thin film transistor, and overlaps the third semiconductor layer and the first gate electrode.

4. The display device according to claim 1, wherein the base coat film includes a first base coat film provided on a base substrate side and a second base coat film provided on the gate insulating film side, and in the second thin film transistor, a third gate electrode configured to control the conduction between the third conductor region and the fourth conductor region is provided between the first base coat film and the second base coat film.

5. The display device according to claim 1, wherein, in the second thin film transistor, a light blocking layer formed of the same material, and in the same layer, as the first semiconductor layer overlaps the second semiconductor layer between the base coat film and the gate insulating film.

6. The display device according to claim 1, further comprising:

a light-emitting element layer provided on the thin film transistor layer, a plurality of light-emitting elements being arranged on the light-emitting element layer; and a sealing film that covers the light-emitting element layer.

7. The display device according to claim 6, wherein each of the plurality of light-emitting elements is an organic electroluminescence element.

8. A method for manufacturing a display device, the display device including:

a base substrate, and a thin film transistor layer provided on the base substrate, wherein:

in the thin film transistor layer, a first thin film transistor, including a first semiconductor layer formed of polysilicon, and a second thin film transistor, including a second semiconductor layer formed of an oxide semiconductor, are provided for each subpixel, the first thin film transistor includes;

the first semiconductor layer provided on a base coat film and including a first conductor region and a second conductor region that are separated from each other, and a first channel region between the first conductor region and the second conductor region, a gate insulating film provided on the first semiconductor layer, a third semiconductor layer provided on the gate insulating film and formed of the same material, and in the same layer, as the second semiconductor layer, a first gate electrode provided on the third semiconductor layer and configured to control conduction between the first conductor region and the second conductor region, an interlayer insulating film that covers the first gate electrode, and a first terminal electrode and a second terminal electrode that are provided on the interlayer insulating film, that are separated from each other, and that are electrically connected to the first conductor region and the second conductor region, respectively, and the second thin film transistor includes:

the gate insulating film, the second semiconductor layer provided on the gate insulating film and including a third conductor region and a fourth conductor region that are separated from each other, and a second channel region between the third conductor region and the fourth conductor region, a first metal layer and a second metal layer provided on the third conductor region and the fourth conductor region, respectively, and formed of the same material, and in the same layer, as the first gate electrode, the interlayer insulating film provided on the first metal layer and the second metal layer, a third terminal electrode and a fourth terminal electrode that are provided on the interlayer insulating film, that are separated from each other, and that are electrically connected to the first metal layer and the second metal layer, respectively, and a second gate electrode configured to control conduction between the third conductor region and the fourth conductor region, the method comprising:

forming the base coat film on the base substrate;

forming the first semiconductor layer on the base coat film;

forming a layered film by sequentially forming the gate insulating film, a second semiconductor film formed of the oxide semiconductor, and a metal film to cover the first semiconductor layer;

forming a resist pattern on the layered film such that the resist pattern overlaps portions, including the first channel region, the second channel region, the third conductor region, and the fourth conductor region, and such that a thickness of a portion of the resist pattern that overlaps the second channel region is less than a thickness of a portion of the resist pattern that overlaps the first channel region, the third conductor region, and the fourth conductor region;

patterning another layered film to form the first gate electrode, the third semiconductor layer, and the second semiconductor layer, by removing the metal film, exposed from the resist pattern, and the second semiconductor film under the metal film;

performing doping using the resist pattern as a mask to form the first conductor region, the first channel region, and the second conductor region;

forming the first metal layer and the second metal layer by removing the metal film, exposed by thinning the resist pattern, by ashing;

forming the interlayer insulating film after removing the resist pattern;

forming contact holes, reaching the first metal layer, the second metal layer, the first conductor region, and the second conductor region, in the interlayer insulating film; and forming the first terminal electrode, the second terminal electrode, the third terminal electrode, and the fourth terminal electrode on the interlayer insulating film.

9. The method according to claim 8, wherein, in patterning the other layered film, the metal film, exposed from the resist pattern, the second semiconductor film, and the gate insulating film, under the metal film, are removed.

10. The method according to claim 8, wherein, in forming the interlayer insulating film, a first interlayer insulating film and a second interlayer insulating film are sequentially formed, and the second gate electrode is formed between the first interlayer insulating film and the second interlayer insulating film.

11. The method according to claim 8, wherein, in forming the base coat film, a first base coat film and a second base coat film are sequentially formed, and a third gate electrode for controlling the conduction between the third conductor region and the fourth conductor region is formed between the first base coat film and the second base coat film.

12. The method according to claim 8, wherein, in forming the base coat film, a first base coat film and a second base coat film are sequentially formed, and the second gate electrode is formed between the first base coat film and the second base coat film.

13. The method according to claim 8, further comprising:

forming a flattening film to cover the first terminal electrode, the second terminal electrode, the third terminal electrode, and the fourth terminal electrode;

forming a light-emitting element layer, the light-emitting element layer including a plurality of light emitting elements arranged on the flattening film; and forming a sealing film that covers the light-emitting element layer.

14. The method according to claim 13, wherein each of the plurality of light-emitting elements is an organic electroluminescence element.

15. The display device according to claim 4, further comprising:

a light-emitting element layer provided on the thin film transistor layer, a plurality of light-emitting elements being arranged on the light-emitting element layer; and a sealing film that covers the light-emitting element layer.

16. A display device comprising:

a base substrate; and a thin film transistor layer provided on the base substrate, wherein:

in the thin film transistor layer, a first thin film transistor, including a first semiconductor layer formed of polysilicon, and a second thin film transistor, including a second semiconductor layer formed of an oxide semiconductor, are provided for each subpixel, the first thin film transistor includes:

the first semiconductor layer provided on a base coat film and including a first conductor region and a second conductor region that are separated from each other, a gate insulating film provided on the first semiconductor layer, a third semiconductor layer provided on the gate insulating film and formed of the same material, and in the same layer, as the second semiconductor layer, a first gate electrode provided on the third semiconductor layer and configured to control conduction between the first conductor region and the second conductor region, an interlayer insulating film that covers the first gate electrode, and a first terminal electrode and a second terminal electrode that are provided on the interlayer insulating film, that are separated from each other, and that are electrically connected to the first conductor region and the second conductor region, respectively, and the second thin film transistor includes:

the gate insulating film, the second semiconductor layer provided on the gate insulating film and including a third conductor region and a fourth conductor region that are separated from each other, a first metal layer and a second metal layer provided on the third conductor region and the fourth conductor region, respectively, and formed of the same material, and in the same layer, as the first gate electrode, the interlayer insulating film provided on the first metal layer and the second metal layer, a third terminal electrode and a fourth terminal electrode that are provided on the interlayer insulating film, that are separated from each other, and that are electrically connected to the first metal layer and the second metal layer, respectively, and a second gate electrode configured to control conduction between the third conductor region and the fourth conductor region, wherein the base coat film includes a first base coat film provided on a base substrate side and a second base coat film provided on a gate insulating film side, and the second gate electrode is provided between the first base coat film and the second base coat film.

17. The display device according to claim 16, wherein the third semiconductor layer and the first gate electrode overlap each other.

18. The display device according to claim 16, wherein the gate insulating film of the first thin film transistor is provided separately from the gate insulating film of the second thin film transistor, and overlaps the third semiconductor layer and the first gate electrode.

19. The display device according to claim 16, further comprising:

a light-emitting element layer provided on the thin film transistor layer, a plurality of light-emitting elements being arranged on the light-emitting element layer; and a sealing film that covers the light-emitting element layer.

20. The display device according to claim 19, wherein each of the plurality of light-emitting elements is an organic electroluminescence element.

* * * * *